(12) United States Patent
Kern et al.

(10) Patent No.: US 12,273,125 B2
(45) Date of Patent: Apr. 8, 2025

(54) BYTE ERROR CORRECTION

(71) Applicant: Infineon Technologies AG, Neubiberg (DE)

(72) Inventors: Thomas Kern, Aschheim (DE); Thomas Rabenalt, Unterhaching (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 10 days.

(21) Appl. No.: 17/944,510

(22) Filed: Sep. 14, 2022

(65) Prior Publication Data
US 2023/0091457 A1    Mar. 23, 2023

(30) Foreign Application Priority Data
Sep. 14, 2021    (DE) .................... 10 2021 123 727.0

(51) Int. Cl.
*H03M 13/15* (2006.01)
*H03M 13/00* (2006.01)

(52) U.S. Cl.
CPC ..... *H03M 13/1575* (2013.01); *H03M 13/611* (2013.01)

(58) Field of Classification Search
CPC ........... H03M 13/1575; H03M 13/611; H03M 13/1515
USPC ....................................................... 714/785
See application file for complete search history.

(56) References Cited

U.S. PATENT DOCUMENTS

| | | | | |
|---|---|---|---|---|
| 7,733,817 B2* | 6/2010 | Choi | ................. | H03M 13/2707 455/414.1 |
| 10,812,109 B2 | 10/2020 | Kern et al. | | |
| 2004/0199857 A1* | 10/2004 | Senda | ................. | H03M 13/155 714/784 |
| 2006/0150066 A1* | 7/2006 | Lee | ................... | H03M 13/1515 714/784 |

(Continued)

FOREIGN PATENT DOCUMENTS

DE    102017125617 A1    5/2019

OTHER PUBLICATIONS

Bossen D, "b-Adjacent Error Correction"; IBM J. Res. Dev. Published Jul. 1970.

(Continued)

*Primary Examiner* — James C Kerveros
(74) *Attorney, Agent, or Firm* — Eschweiler & Potashnik, LLC

(57) ABSTRACT

An approach for correcting at least one byte error in a binary sequence is proposed, the binary sequence comprising a plurality of bytes and being a code word of an error code in the error-free case. The approach comprises the steps of: (i) determining at least one byte error position signal which specifies whether or not a byte of the binary sequence is erroneous, (ii) determining at least one byte error correction value, based on which an erroneous byte position identified by means of the byte error position signal is correctable, the at least one byte error correction value being determined by virtue of a first value and a second value being determined for each of at least two byte positions based on a coefficient of the locator polynomial, and (iii) correcting the at least one byte error based on the at least one byte error correction value.

22 Claims, 18 Drawing Sheets

(56) References Cited

U.S. PATENT DOCUMENTS

| | | | | |
|---|---|---|---|---|
| 2006/0282754 A1* | 12/2006 | Kobayashi | .......... | G06F 11/1008 |
| | | | | 714/E11.034 |
| 2011/0145677 A1* | 6/2011 | Saxena | ............... | H03M 13/152 |
| | | | | 714/759 |
| 2013/0080863 A1* | 3/2013 | Hida | ................. | H03M 13/3715 |
| | | | | 714/784 |
| 2013/0173956 A1* | 7/2013 | Anderson | ........... | H03M 13/373 |
| | | | | 714/6.24 |
| 2019/0042357 A1* | 2/2019 | Wu | ..................... | G06F 11/1028 |
| 2020/0371867 A1* | 11/2020 | Imaizumi | ............ | G06F 11/1032 |

OTHER PUBLICATIONS

Okano, H., Imai, H. "A Construction Method of High-Speed Decoders Using ROM's for Bose-Chaudhuri-Hocquengiem and Reed-Solomon Codes"; IEEE Transactions on Computers, vol. C-36, No. 10. Published Oct. 1987.

Wicker, S. "Error Control Systems for Digital Communication and Storage"; Prentice Hall. Published 1995.

Fujiwara, E. "Code Design for Dependable Systems"; Wiley. Published 2006.

Lin, S., Costello, D. "Error Control Coding"; Prentice Hall. Published 1983.

\* cited by examiner

Fig.13

| Power representation | Polynomial representation | Tuple representation |
|---|---|---|
| — | 0 | (00000) |
| $\alpha^0$ | 1 | (10000) |
| $\alpha^1$ | $x^1$ | (01000) |
| $\alpha^2$ | $x^2$ | (00100) |
| $\alpha^3$ | $x^3$ | (00010) |
| $\alpha^4$ | $x^4$ | (00001) |
| $\alpha^5$ | $1+x^2$ | (10100) |
| $\alpha^6$ | $x^1+x^3$ | (01010) |
| $\alpha^7$ | $x^2+x^4$ | (00101) |
| $\alpha^8$ | $1+x^2+x^3$ | (10110) |
| $\alpha^9$ | $x^1+x^3+x^4$ | (01011) |
| $\alpha^{10}$ | $1+x^4$ | (10001) |
| $\alpha^{11}$ | $1+x^1+x^2$ | (11100) |
| $\alpha^{12}$ | $x^1+x^2+x^3$ | (01110) |
| $\alpha^{13}$ | $x^2+x^3+x^4$ | (00111) |
| $\alpha^{14}$ | $1+x^2+x^3+x^4$ | (10111) |
| $\alpha^{15}$ | $1+x^1+x^2+x^3+x^4$ | (11111) |
| $\alpha^{16}$ | $1+x^1+x^3+x^4$ | (11011) |
| $\alpha^{17}$ | $1+x^1+x^4$ | (11001) |
| $\alpha^{18}$ | $1+x^1$ | (11000) |
| $\alpha^{19}$ | $x^1+x^2$ | (01100) |
| $\alpha^{20}$ | $x^2+x^3$ | (00110) |
| $\alpha^{21}$ | $x^3+x^4$ | (00011) |
| $\alpha^{22}$ | $1+x^2+x^4$ | (10101) |
| $\alpha^{23}$ | $1+x^1+x^2+x^3$ | (11110) |
| $\alpha^{24}$ | $x^1+x^2+x^3+x^4$ | (01111) |
| $\alpha^{25}$ | $1+x^3+x^4$ | (10011) |
| $\alpha^{26}$ | $1+x^1+x^2+x^4$ | (11101) |
| $\alpha^{27}$ | $1+x^1+x^3$ | (11010) |
| $\alpha^{28}$ | $x^1+x^2+x^4$ | (01101) |
| $\alpha^{29}$ | $1+x^3$ | (10010) |
| $\alpha^{30}$ | $x^1+x^4$ | (01001) |

BYTE ERROR CORRECTION

REFERENCE TO RELATED APPLICATIONS

This application claims priority to German Application 10 2021 123 727.0, filed Sep. 14, 2021. The contents of the above-referenced patent applications are hereby incorporated by reference in their entirety.

BACKGROUND

The practice of byte-by-byte detecting and byte-by-byte correcting of errors in data present in the form of bytes is known. In this case, a byte may comprise at least two bits. At least one error in at least one bit of a byte is referred to as a byte error. If at least one bit of a byte is erroneous, a byte error is present. If only at least one bit of a single byte is erroneous, this corresponds to a 1-byte error.

The correction of 1-byte errors is described in [Bossen, D.: b-Adjacent Error Correction, IBM J. Res. Dev., July 1970, pages 402 to 408], for example.

If the bits of two different bytes are erroneous, this corresponds to a 2-byte error. Accordingly, a k-byte error is present if bits in k bytes are erroneous (i.e., at least one bit has an error in each of the k bytes).

There is general motivation to carry out the error correction of possibly erroneous bytes quickly. By way of example, this applies if data present in bytes are intended to be read from a memory in parallel and intended to be provided in parallel. In such a scenario, it may be advantageous also to carry out the error correction in parallel.

In this case, parallel means in particular that an error correction or a part of the error correction for at least two bytes is carried out at least partly simultaneously (for example at least partly overlapping in time as well).

By way of example, the byte error correction can be implemented by means of a Reed-Solomon code.

OKANO [Okano, H., Imai, H.: A Construction Method of High-Speed Decoders Using ROM's for Bose-Chaudhuri-Hocquengiem and Reed-Solomon Codes, IEEE TRANSACTIONS ON COMPUTERS, VOL C-26, NO. 10, OCTOBER 1987, pages 1165 to 1171] has described a circuit arrangement for correcting 2-byte errors using a Reed-Solomon code. A disadvantage here is that the correction of 2-byte errors described in OKANO is comparatively slow.

The object of the invention consists of avoiding disadvantages of known solutions for correcting byte errors and, in particular, of facilitating an error correction of errors in a plurality of bytes that is as fast as possible.

In particular, it is an object to provide an error correction of m-byte errors with m≥2 for memory cells, e.g., MRAM memory cells, RRAM memory cells, etc., and thus increase the reliability of data read from the memory cells.

This object is achieved in accordance with the features of the independent claims. Preferred embodiments are able to be gathered from the dependent claims in particular.

A circuit arrangement is proposed for correcting at least one byte error in a binary sequence comprising a plurality of bytes, the binary sequence being a code word of an error code in the error-free case and the circuit arrangement being configured to determine at least one byte error position signal which specifies whether or not a byte of the binary sequence is erroneous, to determine at least one byte error correction value, on the basis of which an erroneous byte position identified by means of the byte error position signal is correctable, the at least one byte error correction value being determined by virtue of a first value and a second value being determined for each of at least two byte positions on the basis of a coefficient of the locator polynomial, to correct the at least one byte error on the basis of the at least one byte error correction value.

In this context, it should be observed that one byte error position signal can be determined for each byte of the binary sequence. Consequently, a byte error position signal is linked or associated with each byte of the binary sequence. The value of the byte error position signal indicates whether or not the byte linked with the byte error position signal has an error.

By way of example, the error code is an error-correcting and/or error-detecting code. By way of example, a Reed-Solomon code can be used as error code.

In a development, at least one of the byte error correction values is determined for at least one correct byte.

In a development, a 2-byte error is corrected.

In a development, the error code is a Reed Solomon code in a Galois field $GF(2^m)$, the code being able to correct at least 2-byte errors.

In a development, the first value is multiplied by a constant assigned to the byte position and is XORed with the second value component by component, the multiplication by the constant being a multiplication in the Galois field $GF(2^m)$.

In a development, the locator polynomial is a second degree polynomial and the coefficient of the locator polynomial is a coefficient of the linear term of the locator polynomial.

In a development, the coefficient of the locator polynomial is determinable as a component-by-component XORing of $\alpha^i$ and $\alpha^j$ if the byte error position signal assumes a first value for positions i and j to be corrected and assumes a second value for all other positions to be corrected, the second value differing from the first value and $\alpha^i$ and $\alpha^j$ being determined by two zeros of the locator polynomial.

Further, in a development, the bytes have m bits, four m-bit wide error syndrome components $s_1$, $s_2$, $s_3$ and $s_4$ are determinable, the first and the second values being determined on the basis of the value of the one coefficient of the locator polynomial and on the basis of two of the four syndrome components.

In a development, the four error syndrome components are determined such that the following holds true in the case of the 2-byte error with a byte error value a=a(i) at an i-th byte position and a byte error value b=a(j) at a j-th byte position:

$s_1 = a + b,$ $s_2 = \alpha^i \cdot a + \alpha^j \cdot b,$ $s_3 = \alpha^{2i} \cdot a + \alpha^{2j} \cdot b,$ $s_4 = \alpha^{3i} \cdot a + \alpha^{3j} \cdot b,$ wherein $\alpha^i$, $\alpha^j$ are elements of the Galois field $GF(2^m)$ which correspond to the byte positions i and j, and a=a(i) and b=a(j) each comprise m bit.

In a development, the four error syndrome components are determined such that the following holds true in the case of the 2-byte error with a byte error value a=a(i) at an i-th byte position and a byte error value b=a( ) at a j-th byte position:

$s_1 = \alpha^i \cdot a + \alpha^j \cdot b,$ $s_2 = \alpha^{2i} \cdot a + \alpha^{2j} \cdot b,$ $$s_3 = \alpha^{3i} \cdot a + \alpha^{3j} \cdot b,$$

$$s_4 = \alpha^{4i} \cdot a + \alpha^{4j} \cdot b,$$

wherein $\alpha^i$, $\alpha^j$ are elements of the Galois field $GF(2^m)$ which correspond to the byte positions i and j, and $a=a(i)$ and $b=a(j)$ each comprise m bit.

In a development, the locator polynomial is a second degree polynomial according to $$L_2(x) = x^2 + \sigma_1 x + \sigma_2$$

with coefficients $\sigma_1$ and $\sigma_2$, with the at least one byte error correction value being determined on the basis of the coefficient $\sigma_1$.

Alternatively, the locator polynomial may have the following representation:

$$L_2'(x) = 1 + \sigma_1 x + \sigma_2 x^2.$$

The explanations given here then apply accordingly.

In a development, the first value is determined by $$\frac{s_1}{\sigma_1}$$

and the second value is determined by $$\frac{s_2}{\sigma_1} + s_1.$$

In a development, the at least one byte error correction value $a(i)$ for a byte position i is determined on the basis of the coefficient $\sigma_1$ of the locator polynomial, according to $$a(i) = \frac{s_2}{\sigma_1} + s_1 + \frac{s_1}{\sigma_1} \cdot \alpha^i,$$

where $\alpha^i$ is an element of the Galois field $GF(2^m)$ which is assigned to the i-th byte position.

In a development, the at least one byte error correction value $a(i)$ for a byte position i is determined on the basis of the coefficient $\sigma_1$ of the locator polynomial, according to $$a(i) = \left(\frac{s_2}{\sigma_1} + s_1\right) \cdot \alpha^{-i} + \frac{s_1}{\sigma_1}.$$

where $\alpha^i$ is an element of the Galois field $GF(2^m)$ which is assigned to the i-th byte position.

In a development, the at least one byte error correction value $a(i)$ is determined such that the following holds true:

$$\frac{s_2}{\sigma_1} = s_2 \left(\frac{s_1 s_3 + s_2^2}{s_1 s_4 + s_2 s_3}\right)$$

and $$\frac{s_1}{\sigma_1} = s_1 \left(\frac{s_1 s_3 + s_2^2}{s_1 s_4 + s_2 s_3}\right).$$

In a development, the at least one byte error position signal and/or at least one byte error correction value are determined in parallel.

In particular, at least two byte error correction values can be determined in parallel. In this context, parallel means in particular that values are determined at least partly in parallel with one another, that is to say for example simultaneously or at least partly simultaneously.

In a development, the error code is a t-byte error correcting code, with at least (t+1) byte error position signals being determined in parallel.

In a development, the error code is a t-byte error correcting code, with at least (t+1) byte error correction values being determined in parallel.

In a development, the circuit arrangement is configured to correct one of the byte errors by virtue of the byte error position signal being linked with the byte error correction value for the erroneous byte.

Furthermore, a method for correcting at least one byte error in the binary sequence comprising a plurality of bytes is proposed for the purposes of achieving the object, the binary sequence being a code word of an error code in the error-free case, the method comprising the steps of:

determining at least one byte error position signal which specifies whether or not a byte of the binary sequence is erroneous, determining at least one byte error correction value, on the basis of which an erroneous byte position identified by means of the byte error position signal is correctable, the at least one byte error correction value being determined by virtue of a first value and a second value being determined for each of at least two byte positions on the basis of a coefficient of the locator polynomial, correcting the at least one byte error on the basis of the at least one byte error correction value.

The explanations given above in relation to the device apply accordingly to the method. The steps of the method described here can be carried out by means of the device.

The above-described properties, features and advantages of this invention and the way in which they are achieved are described below in association with a schematic description of exemplary embodiments which are explained in greater detail in association with the drawings. In this case, for the sake of clarity, identical or identically acting elements may be provided with identical reference signs.

BRIEF DESCRIPTION OF THE DRAWINGS

FIG. 13 shows a table illustrating different representations of elements of a Galois field GF($2^m$) with m=5.

FIG. 1A shows a simplified schematic diagram of an exemplary embodiment of a device implementing the circuits of one or more of FIGS. 1-12.

DESCRIPTION

Figure 1:
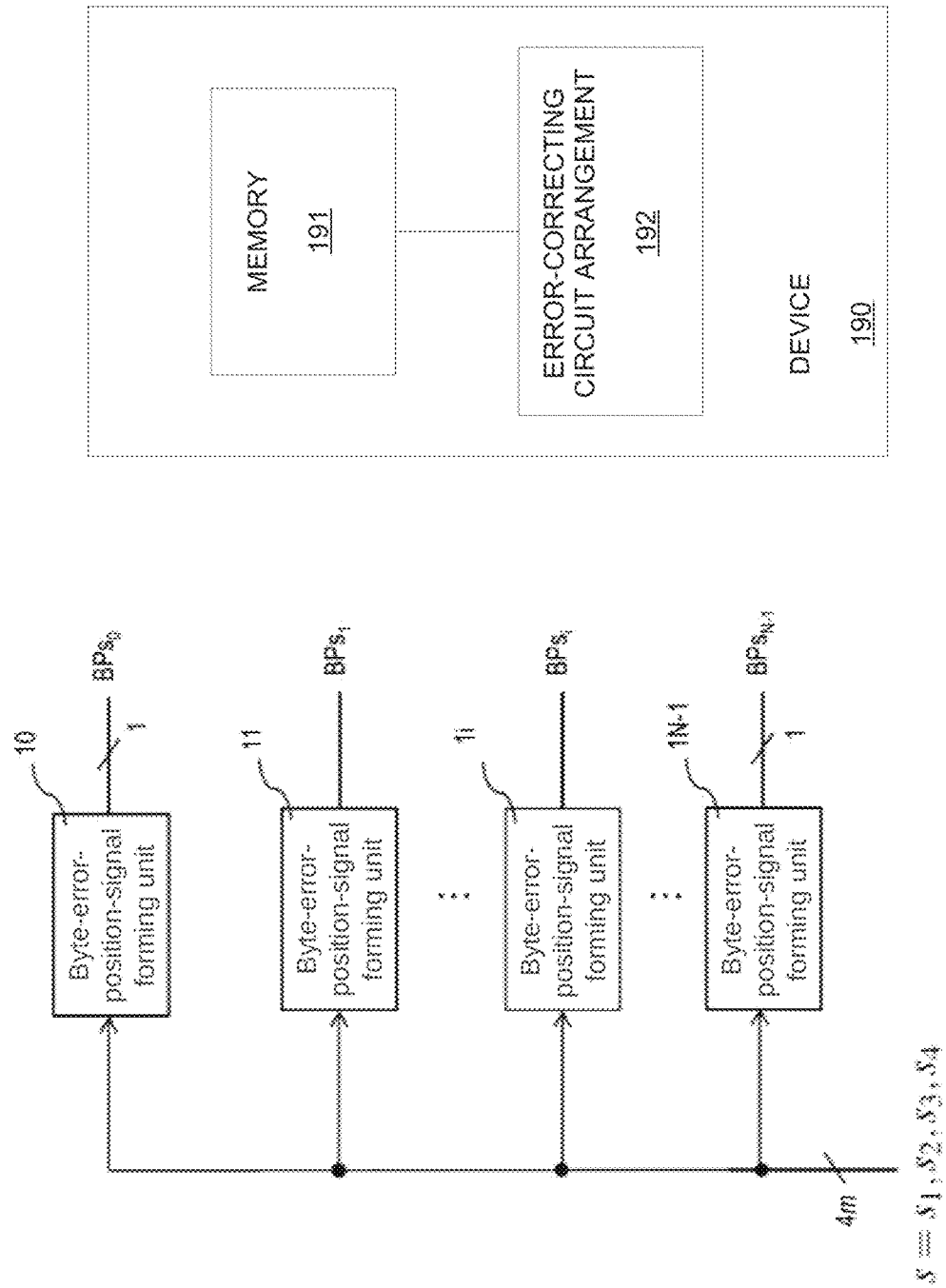
FIG. 1 shows an exemplary circuit arrangement for the parallel formation of byte error position signals for 2-byte errors.

By way of example, a correction of byte errors using a Reed-Solomon code is discussed below. In this case, a byte can comprise a plurality of bits.

For each correctable byte position a signal (also referred to as a byte error position signal) is determined on the basis of which it is possible to ascertain whether or not the byte is erroneous. By way of example, the byte error position signal has the value 1 if the byte is erroneous, or the value 0 if the byte is not erroneous.

The byte error position signal is preferably determined by a value of a locator polynomial. In the case of byte-error-correcting codes, a dedicated locator polynomial can be used for any number of errors.

Consequently, it is proposed, in particular, to determine a byte error position signal for correctable byte positions of a byte-error-correcting code, the byte-error-correcting code being able to correct in particular at least two byte errors.

In this case, a correctable byte position is a byte position for which a correction is provided if an error occurs which is correctable by the byte-error-correcting code.

The bytes are for example data bytes, a combination of data bytes and check bytes or a subset thereof. Data bytes preferably contain payload data.

For a byte position it is possible to determine a byte error correction value on the basis of which the byte position is then corrected if an error has occurred there. The byte error position signal indicates whether an error has occurred for a byte and this error can be corrected by means of the byte error correction value. Individual byte positions at which no correction is intended to be carried out can thus be masked out (masked) by means of the byte error position signal.

In particular, in one option, a byte error correction value that is not intended to be used for correction at a byte position (e.g., because this byte position is not erroneous) is multiplied by 0. In this respect, multiplying the byte error correction value by 0 also corresponds to not using the byte error correction value at a byte position.

Reed-Solomon Code, General Description

Some terms and properties of the Reed-Solomon codes are explained below.

By way of example, t-byte-error-correcting codes and t-byte-error-correcting and (t+1)-byte-error-detecting codes are considered. In particular, the cases t=2 and t=1 are taken into account.

By way of example, known Reed-Solomon codes can be used as byte-error-correcting codes. For Reed-Solomon codes reference should be made for example to [Lin, S., Costello, D.: Error Control Coding, Prentice Hall, 1983, pages 170 to 177] or [Wicker, S.: Error Control Systems for Digital Communication and Storage, Prentice Hall, 1995, pages 214 to 224].

A 1-byte-error-correcting and 2-byte-error-detecting Reed-Solomon code has an H matrix $H_{Byte}^*$ as follows:

$$H_{Byte}^* = \begin{pmatrix} \alpha^0 & \alpha^1 & \alpha^2 & \ldots & \alpha^{2^m-2} \\ \alpha^0 & \alpha^2 & \alpha^4 & \ldots & \alpha^{2(2^m-2)} \\ \alpha^0 & \alpha^3 & \alpha^6 & \ldots & \alpha^{3(2^m-2)} \end{pmatrix} \quad (1)$$

In this case, $\alpha^i$ are elements of the Galois field GF($2^m$). They are present for example in an exponential representation. $\alpha$ can be a primitive element of the Galois field GF($2^m$). The exponents j of $\alpha^j$ should be interpreted modulo $2^m-1$.

It is possible to derive from the H matrix in accordance with equation (1) an H matrix $$H_{Byte} = \begin{pmatrix} \alpha^0 & \alpha^0 & \alpha^0 & \ldots & \alpha^0 \\ \alpha^0 & \alpha^1 & \alpha^2 & \ldots & \alpha^{2^m-2} \\ \alpha^0 & \alpha^2 & \alpha^4 & \ldots & \alpha^{2(2^m-2)} \end{pmatrix} \quad (2)$$

by multiplying, for i=0, ..., ($2^m-2$) the i-th column by $\alpha^{-i}$. This changes only the shape of the H matrix, and not the code, since $\alpha^{-i} \neq 0$. This is also described for example in [Fujiwara, E.: Code Design for Dependable Systems, Wiley, 2006, page 65], where the value "1" is used for $\alpha^0$ since $\alpha^0$ is the unity of the Galois field used.

The following H matrix is used for a 2-byte-error-correcting and 3-byte-error-detecting code:

$$H_{Byte} = \begin{pmatrix} \alpha^0 & \alpha^0 & \alpha^0 & \ldots & \alpha^0 \\ \alpha^0 & \alpha^1 & \alpha^2 & \ldots & \alpha^{2^m-2} \\ \alpha^0 & \alpha^2 & \alpha^4 & \ldots & \alpha^{2(2^m-2)} \\ \alpha^0 & \alpha^3 & \alpha^6 & \ldots & \alpha^{3(2^m-2)} \\ \alpha^0 & \alpha^4 & \alpha^8 & \ldots & \alpha^{4(2^m-2)} \end{pmatrix} \quad (3)$$

Each column of the H matrix specified in equation (3) corresponds to one byte.

If the length of the code is equal to N bytes or m·N bits (where each byte has m bits), only N columns of the H matrices in accordance with equation (1) or equation (3) are used. By way of example, the remaining (last) $2^m-2-N$ columns can then be deleted.

Generally, for a t-byte-error-correcting and t+1-byte-error-detecting code, the H matrix can be specified as follows:

$$H_{Byte} = \begin{pmatrix} \alpha^0 & \alpha^0 & \alpha^0 & \ldots & \alpha^0 \\ \alpha^0 & \alpha^1 & \alpha^2 & \ldots & \alpha^{2^m-2} \\ \alpha^0 & \alpha^2 & \alpha^4 & \ldots & \alpha^{2(2^m-2)} \\ \alpha^0 & \alpha^3 & \alpha^6 & \ldots & \alpha^{3(2^m-2)} \\ \alpha^0 & \alpha^4 & \alpha^8 & \ldots & \alpha^{4(2^m-2)} \\ \vdots & \vdots & \vdots & \ldots & \vdots \\ \alpha^0 & \alpha^{2t\cdot 1} & \alpha^{2t\cdot 2} & \ldots & \alpha^{2t\cdot(2^m-2)} \end{pmatrix}$$

A code that can correct 2-byte errors and detect 3-byte errors is considered by way of example below.

If an error occurs, a correct vector $v = v^0, \ldots, v^{N-1}$ is disturbed to an erroneous vector $v' = v'^0, \ldots, v'^{N-1}$.

The components $v^0, \ldots, v^{N-1}$ of the vector v are bytes that each comprise m bits, such that $v^i = v_1^i, \ldots, v_m^i$ holds true for $i = 0, \ldots, N-1$. The $v_1^i, \ldots, v_m^i$ are thus the m bits of the i-th byte.

An m-bit byte can also be referred to as an element of the Galois field $GF(2^m)$.

If a 1-byte error is present, only a single byte is erroneous, that is to say that for a specific $i \in \{0, \ldots, N-1\}$ the associated i-th byte is erroneous.

If the correct i-th byte is designated by $v^i = v_1^i, \ldots, v_m^i$ and the erroneous i-th byte is designated by $v'^i = v_1'^i, \ldots, v_m'^i$, 1 or 2 or up to m bits of the correct i-th byte can differ from the erroneous i-th byte.

A byte error in the i-th byte can be described by
the erroneous byte position $i$ and
a byte error value $$e^i = v^i \oplus v'^i = v_1^i \oplus v_1'^i, \ldots, v_m^i \oplus v_m'^i.$$

In this case, it should be noted that "$\oplus$" denotes the exclusive-OR operation.

The position of an i-th byte can also be designated by $\alpha^i$.

If the intention is to correct a byte error having the byte error value $e^i$ in the byte position i, then a byte error correction value that is equal to the byte error value is to be determined for the byte position i.

In this example, for a byte error to be corrected, the byte error value is equal to the byte error correction value; in this respect, the terms byte error value and byte error correction value can be used synonymously.

In order to avoid a confusing number of indices, hereinafter byte error values are designated by the alphabetic letters a, b, c.

A byte error correction value for the i-th byte can also be designated by $a(i)$.

Byte positions can be designated by $i, j, k, \ldots$ or by $\alpha^i, \alpha^j, \alpha^k, \ldots$, where $\alpha$ is a generating element of the Galois field $GF(2^m)$.

An error syndrome s has syndrome components (also referred to as components, error syndrome components, partial error syndromes or partial syndromes) $s_1, s_2, s_3, s_4, s_5$, which are determined for the H matrix in accordance with equation (3) as:

$$s_1 = (\alpha^0, \alpha^0, \ldots, \alpha^0) \cdot (v'^0, v'^1, \ldots, v'^{N-1})^T,$$

$$s_2 = (\alpha^0, \alpha^1, \ldots, \alpha^{N-1}) \cdot (v'^0, v'^1, \ldots, v'^{N-1})^T,$$

$$s_3 = (\alpha^0, \alpha^2, \ldots, \alpha^{2(N-1)}) \cdot (v'^0, v'^1, \ldots, v'^{N-1})^T,$$

$$s_4 = (\alpha^0, \alpha^3, \ldots, \alpha^{3(N-1)}) \cdot (v'^0, v'^1, \ldots, v'^{N-1})^T,$$

$$s_5 = (\alpha^0, \alpha^4, \ldots, \alpha^{4(N-1)}) \cdot (v'^0, v'^1, \ldots, v'^{N-1})^T,$$

In this case, $(v'^0, \ldots, v'^{N-1})^T$ is a column vector having the components $v'^0, \ldots, v'^{N-1}$ which can also be referred to as a transposed vector of the row vector $(v'^0, \ldots, v'^{N-1})$.

The syndrome components $s_1, s_2, s_3, s_4, s_5$ respectively form a byte having m bits.

If no error is present, the following holds true: $s_1 = s_2 = s_3 = s_4 = s_5 = 0$.

If a 1-byte error having the byte error value a in the i-th byte error position is present, the following holds true:

$$s_1 = \alpha^0 \cdot a = a$$

$$s_2 = \alpha^i \cdot a$$

$$s_3 = \alpha^{2i} \cdot a$$

$$s_4 = \alpha^{3i} \cdot a$$

$$s_5 = \alpha^{4i} \cdot a. \quad (4)$$

If a 2-byte error having the byte error values a and b in the byte error positions i and j is present, the following holds true:

$$s_1 = \alpha^0 a + \alpha^0 b = a + b$$

$$s_2 = \alpha^i \cdot a + \alpha^j \cdot b$$

$$s_3 = \alpha^{2i} \cdot a + \alpha^{2j} \cdot b$$

$$s_4 = \alpha^{3i} \cdot a + \alpha^{3j} \cdot b$$

$$s_5 = \alpha^{4i} \cdot a + \alpha^{4j} \cdot b. \quad (5)$$

If a 3-byte error having the byte error values a, b and c in the byte error positions i, j and k is present, the following holds true:

$$s_1 = \alpha^0 a + \alpha^0 b + \alpha^0 c = a + b + c$$

$$s_2 = \alpha^i \cdot a + \alpha^j \cdot b + \alpha^k \cdot c$$

$$s_3 = \alpha^{2i} \cdot a + \alpha^{2j} \cdot b + \alpha^{2k} \cdot c$$

$$s_4 = \alpha^{3i} \cdot a + \alpha^{3j} \cdot b + \alpha^{3k} \cdot c$$

$$s_5 = \alpha^{4i} \cdot a + \alpha^{4j} \cdot b + \alpha^{4k} \cdot c. \quad (6)$$

The following relationships are satisfied for the errors considered:

1. For a 1-byte error the following holds true $$s_1 = a \neq 0 \quad (7)$$

and $$s_1 \cdot s_3 + s_2^2 + 0. \quad (8)$$

2. For a 2-byte error the following holds true $$s_1 \cdot s_3 + s_2^2 = a \cdot b \cdot [\alpha^{2i} + \alpha^{2j}] \neq 0. \quad (9)$$

and $$\text{Det}\begin{pmatrix} s_1 & s_2 & s_3 \\ s_2 & s_3 & s_4 \\ s_3 & s_4 & s_5 \end{pmatrix} = s_1 s_3 s_5 + s_3^3 + s_4^2 s_1 + s_2^2 s_5 = 0. \quad (10)$$

3. For a 3-byte error the following holds true $$\text{Det}\begin{pmatrix} s_1 & s_2 & s_3 \\ s_2 & s_3 & s_4 \\ s_3 & s_4 & s_5 \end{pmatrix} = s_1 s_3 s_5 + s_3^3 + s_4^2 s_1 + s_2^2 s_5 = \quad (11)$$

$$a \cdot b \cdot c \cdot \{\alpha^{2i} + \alpha^{2j}\} \cdot \{\alpha^{2i} + \alpha^{2k}\} \cdot \{\alpha^{2j} + \alpha^{2k}\} \neq 0.$$

The byte error positions $\alpha^i$ and $\alpha^j$, in the case of the 2-byte error in the i-th byte and in the j-th byte, can be determined as solution, roots or zeros of the equation $$x^2\{s_1 s_3 + s_2^2\} + x\{s_1 s_4 + s_2 s_3\} + s_2 s_4 + s_3^2 = 0.$$

$$L(x) = x^2\{s_1 s_3 + s_2^2\} + x\{s_1 s_4 + s_2 a_3\} + s_2 s_4 + s_3^2 \quad (12)$$

can also be referred to as a second degree locator polynomial.

Correspondingly, the byte error positions for the 1-byte error are determined by a zero of a first degree locator polynomial and, generally, the erroneous byte positions of a t-byte error for a t-byte-error-correcting code for $1 \leq \tau \leq t$ are determined by zeros of a t-th degree locator polynomial.

If a code word consists of N·m bits and thus of N bytes, then there are only N different byte positions which are taken into consideration as byte error positions. In a corresponding bit-correcting code, by contrast, there are m·N possible erroneous bit positions.

A first degree locator polynomial is used in the case of a 1-byte error and a second degree locator polynomial is used in the case of a 2-byte error.

Reed-Solomon Code, Supplementary Explanations

It is possible, in the case of a 2-byte error, to determine a byte error correction value a(i) for an i-th byte depending only on the syndrome components $s_1$, $s_2$, $s_3$ and the byte position i.

In this case, it is advantageous that a plurality of byte error correction values can be determined in parallel for at least three correctable bytes, for example.

By way of example, let it be assumed that a 2-byte error is present. The byte error correction value for each byte position can be determined in parallel on the basis of the syndrome components $s_1$, $s_2$, $s_3$ provided and the known position of each of the correctable bytes. A byte error correction value is determined for the two erroneous bytes and at least for one non-erroneous byte.

A byte error correction value determined for an i-th byte position corresponds to the byte error value at this i-th position.

A byte error position signal likewise determined (if appropriate in parallel) stipulates whether a byte error is present in the byte under consideration and the correction is carried out with the byte error correction value. If the byte error position signal indicates that no byte error is present in the corresponding position, no correction is carried out with the byte error correction value determined for this position.

In other words: the byte error position signal determines the byte positions at which a correction is carried out with the byte error correction value provided: if the byte error position signal indicates a byte error for a byte position, the correction is carried out with the byte error correction value; if the byte error position signal does not indicate a byte error for this byte position, no correction is carried out.

If a t-byte-error-correcting code is considered, the corresponding byte error correction value can be determined for more than t correctable byte positions even before the byte error position signals have been determined for (all or a portion of the) byte positions. The byte error correction value can also be determined in parallel with the byte error position signal.

If no byte error is present in an i-th byte, the byte error correction value determined for this i-th byte is not used for correction on account of the value of the byte error position signal. In this case, it is not necessary for the byte error correction value determined for this non-erroneous byte to be equal to $$0 = \underbrace{0, \ldots, 0}_{m}$$

since the correction is excluded on account of the byte error position signal. Optionally, in this case it is possible to set the byte error correction value for the i-th byte $$0 = \underbrace{0, \ldots, 0}_{m}$$

If a 2-byte error is present, the byte error correction value a(i) of the i-th byte can be determined for a byte error position i such that the following holds true:

$$a(i) = \frac{s_1 s_3 + s_2^2}{s_3 + \alpha^{2i} s_1} \quad (13)$$

If a byte position i at which a byte error has occurred is known for a 2-byte error, on the basis of equation (13) the byte error correction value a(i) for the erroneous byte position i is determined by the syndrome components $s_1$, $s_2$, $s_3$ and the value $\alpha^i$ determined from the byte position i.

For a byte position k, the byte error correction value a(k) where $$a(k) = \frac{s_1 s_3 + s_2^2}{s_3 + \alpha^{2k} s_1} \quad (14)$$

is determined in parallel, for example, independently of whether the byte position k is actually erroneous.

If the byte error position signal indicates that a byte error is present in the byte position k, an error correction of the k-th byte is carried out with the byte error correction value a(k) determined for this byte position k.

If the byte error position signal indicates that no byte error is present in the byte position k, no error correction of the k-th byte is carried out and the byte error correction value a(k) determined for this k-th byte is not used for error correction. Optionally, the byte error correction value can be set to 0.

The byte error correction value for a byte position can thus already be present even before the fact of whether an error has actually occurred at this byte position has been determined.

For different byte positions, the corresponding byte error correction values can be determined in parallel. In particular, the byte error correction values can be determined in parallel for all correctable byte positions or for a subset of the correctable byte positions.

If the byte-error-correcting code can correct up to t erroneous bytes, then more than t byte error correction values can be determined in parallel, for example for all correctable byte positions or else for a subset of at least t+1 correctable byte positions, independently of whether a byte error is present at a byte position.

The value of the byte error position signal determines whether the byte error correction value is used for correcting the corresponding byte.

Correctable byte positions can be for example all data bytes, a subset of the data bytes, check bytes, all bytes of a code word of a t-byte-error-correcting code or a subset of bytes of a code word of the t-byte-error-correcting code.

In this case, the byte error position signal can be determined for example such that for a byte position it assumes a first value if the byte of the byte position is erroneous, and that it assumes a second value, different than the first value, if the byte of the byte position is not erroneous.

The byte error position signal can be determined using the corresponding locator polynomial.

Byte Error Position Signal for the 1-Byte Error

For a 1-byte error, the first degree locator polynomial is with the solution or zero $$\alpha^i = \frac{s_2}{s_1}. \quad (16)$$

The byte error correction value a(i) for the erroneous byte position i is $$a(i) = s_1. \quad (17)$$

For every k-th byte, a byte error correction value $$a(k) = s_1 = a \quad (18)$$

is determined.

If an error is present in the i-th byte with the byte error correction value a, such that $s_1 = a$, for each byte k a byte error correction value a(k)=a is determined according to equation (18), which byte error correction value is used for the i-th byte that is actually to be corrected, and is masked (e.g. set to zero) for the bytes that are not to be corrected. The decision as to whether or not a byte is corrected is taken on the basis of the value of the corresponding byte error position signal.

For each byte, in the case of a 1-byte error, a byte error position signal is determined using equation (15). The byte error position signal for the byte position i is
  equal to 1, if $\alpha^i$ is a zero of the locator polynomial in accordance with equation (15) and
  equal to 0 if $\alpha^i$ is not a zero of the locator polynomial in accordance with equation (15).

A correction of the i-th byte is carried out only if $\alpha^i$ is a zero of the locator polynomial in accordance with equation (15).

Byte Error Position Signal for the 2-Byte Error

The effect of the byte error position signal during the correction of a 2-byte error is illustrated on the basis of an example:

If a t-byte-error-correcting code where t≥2 is used, then in the case of a 2-byte error the erroneous byte positions are determined by the two zeros of the second degree locator polynomial in accordance with equation (12).

If the erroneous byte positions are the positions i and j, the byte error position signal is for example equal to 1 if $\alpha^i$ and $\alpha^j$ are in each case a zero of the second degree locator polynomial in accordance with equation (12), and equal to 0 in all other cases.

For each byte position k, it is possible to determine a byte error correction value $$a(k) = \frac{s_1 \cdot s_3 + s_2^2}{s_3 + \alpha^{2k} s_1}$$

These byte error correction values can be determined at least partly in parallel.

The value of the byte error position signal for the byte position k determines whether a correction is carried out at this byte position k. If the byte error position signal is equal to 1, a correction is carried out; if the byte error position signal is equal to 0, no correction is carried out.

For the byte position k=i, the byte error correction value a(i) is determined such that the erroneous i-th byte is corrected by means of the byte error correction value a(i). Likewise, for the byte position k=j, the byte error correction value a(j) is determined such that the erroneous j-th byte is corrected by means of the byte error correction value a(j).

For all other byte positions k where k≠i, j, no byte error is present, and so no correction is required for these byte positions. Even if a byte error correction value a(k) not equal to 0 has been determined, it is not used for correction because the byte error position signal at this byte position assumes the value 0 and thus indicates that no correction is required for this byte position.

Treatment of 1-Byte Errors, 2-Byte Errors and 3-Byte Errors

A description is given below of how byte errors can be detected and differentiated from one another. By way of example, a 2-byte-error-correcting code is considered. A 3-byte error detection is also described supplementarily.

1. The case where only a 1-byte error or a 2-byte error is present is firstly taken as a basis. In such an example, the following holds true for a 2-byte error in accordance with equation (9)

$$s_1 s_3 + s_2^2 \neq 0$$

and for a 1-byte error both of equations (7) and (8) hold true $$s_1 \neq 0$$

$$s_1 s_3 + s_2^2 = 0.$$

In addition, it is also necessary to distinguish the case where neither a 1-byte error nor a 2-byte error has occurred. The conclusion that neither a 1-byte error nor a 2-byte error has occurred can already be drawn from $s_1 = 0$.

If the probability for a 3-byte error is extremely low, the conclusion that no error has occurred can be drawn for this case.

2. The case where only a 1-byte error or only a 2-byte error or only a 3-byte error is present is now considered. For a 3-byte error the following holds true in accordance with equation (11)

$$s_1 s_3 s_5 + s_3^3 + s_4^2 s_1 + s_2^2 s_5 \neq 0.$$

The following correspondingly holds true for a 2-byte error or for a 1-byte error:

$$s_1 s_3 s_5 + s_3^3 + s_4^2 s_1 + s_2^2 s_5 \neq 0. \quad (19)$$

If a 2-byte error is present, equation (9) additionally holds true $$s_1s_3+s_2^2 \neq 0.$$

For a 1-byte error, equations (7) and (8) once again hold true $$s_1 \neq 0$$

$$s_1s_3+s_2^2=0.$$

From the condition in accordance with equation (9) alone it is not possible to deduce that a 2-byte error is present, since this condition also holds true for the 3-byte error.

The correction of 2-byte errors can be carried out as follows: for each byte position i where $i \in \{0, 1, \ldots, N-1\}$, a value $L(a^i)$ of the second degree locator polynomial is determined in accordance with $$L(\alpha^i)=\alpha^{2i}\{s_1s_3+s_2^2\}+\alpha^i\{s_1s_4+s_2s_3\}+s_2s_4+s_3^2. \quad (20)$$

If $L(a^i)=0$, the i-th byte is corrected. If $L(a^i) \neq 0$, then the i-th byte is not corrected. A byte error position signal $BPs_i$ can specify whether or not a correction of the respective byte is carried out. The byte error position signal $BPs_i$ is determined for example by $$BPs_i = \begin{cases} 1 & \text{if } L(\alpha^i) = 0, \\ 0 & \text{if } L(\alpha^i) \neq 0. \end{cases} \quad (21)$$

In the case of circuit arrangements which realize operations in a Galois field $GF(2^m)$, use is made of, for example, multipliers, constant multipliers, squarers, (third) power forming units or the like. The circuitry implementation of individual operations of this type is known. An illustration is given below by way of example of how multipliers, squarers, third power forming units and constant multipliers can be realized in a Galois field determined for example by its modular polynomial. By way of example, m=5 is assumed, such that a byte consists of m=5 bits and the corresponding Galois field is $GF(2^5)$.

Example in the Galois Field $GF(2^m)$ where m=5 m=5 is chosen by way of example, such that the underlying Galois field $$GF(2^m)=GF(2^5)=GF(32)$$

comprises a total of 32 elements.

Elements of the Galois field GF(32) are presented in their various forms of representation in FIG. 13. The modular polynomial of the Galois field GF(32) is the polynomial $$p(x)=1+s^2+x^5.$$

The first column of the table shown in FIG. 13 comprises the elements $\alpha^i \neq 0$ of the $GF(2^5)$ for i=0, 1, . . . , 30 in exponent representation (also referred to as exponential representation). The zero element of the field has no exponent representation. The second column of the table lists all elements in their polynomial representation for the associated modular polynomial p(x). The third column of the table shows the tuple or vector representation of the elements of the $GF(2^5)$. The vector representation of an element can be read directly from the polynomial representation. In this case, the five components of the vector representation correspond, from left to right, to the coefficients of the associated powers $$x^0, x^1, x^2, x^3, x^4$$

in the polynomial representation.

The corresponding polynomial representation results from the power representation $\alpha^i$ by determining $[x^i$ modulo $(1+x^2+x^5)]$. By way of example, the polynomial representation of $\alpha^5$ is equal to $1+x^2$ since $$x^5 \text{ modulo}(1+x^2+x^5)=1+x^2$$

holds true.

The multiplication of two elements of the Galois field can be performed in the exponent representation or in the polynomial representation. If two elements of the Galois field $GF(2^m)=GF(2^5)$ are given in the exponent representation $\alpha^i$ and $\alpha^j$, their product results as:

$$\alpha^i \cdot \alpha^j = \alpha^k \text{ where } k=(i+j) \text{modulo}(2^m-1)=(i+j) \text{modulo } 31.$$

If the elements to be multiplied in the Galois field are present in their vector representation or in their polynomial representation, their multiplication can be performed by a Galois field multiplier. The multiplication of two elements in their polynomial representation is described by way of example below. In order to multiply together two elements given as elements of the Galois field $GF(2^m)=GF(2^m)$ in their polynomial representation, the polynomials should be multiplied together directly in the customary manner, and the result should be determined modulo the modular polynomial.

If the polynomials $1+x^2+x^3$ and $x+x^3$ are given, for example, then their direct multiplication yields $$(1+x^2+x^3)(x+x^3)=x+x^4+x^5+x^6.$$

Owing to $$x^5=1+x^2 \text{ modulo}(1+x^2+x^5) \text{ and}$$

$$x^6=x+x^3 \text{ modulo}(1+x^2+x^5)$$

it follows that $$x+x^4+x^5+x^6=x+x^4+1+x^2+x+x^3=1+x^2+x^3+x^4.$$

The following thus holds true as a result:

$$(1+x^2+x^3)\cdot(x+x^3)=1+x^2+x^3+x^4.$$

A description is given below of the case according to which a first element a(x) where $$a(x)=a_4x^4+a_3x^3+a_2x^2+a_1s+a_0$$

and a second element b(x) where $$b(x)=b_4x^4+b_3x^3+b_2s^2+b_1x+b_0$$

in the Galois field $GF(2^5)$ are multiplied by the modular polynomial $$m(x)=x^5+x^2+1.$$

Directly multiplying out the polynomials a(x) and b(x) yields firstly an 8-th degree polynomial. With $$x^5 \text{ modulo}(1+x^2+x^5)=1+x^2,$$

$$x^6 \text{ modulo}(1+x^2+x^5)=x+x^3,$$

$$x^7 \text{ modulo}(1+x^2+x^5)=x^2+x^4,$$

$$x^8 \text{ modulo}(1+x^2+x^5)=1+x^2+x^3,$$

a fourth degree polynomial arises as follows:

$$\begin{aligned}
c_4x^4 + c_3x^3 + c_2x^2 + c_1x^1 + c_0 &= a(x) \cdot b(x) \bmod m(x) \\
&= (a_0b_4 + a_1b_3 + a_2b_2 + a_3b_1 + a_3b_4 + a_4b_0 + a_4b_3) \cdot x^4 \\
&+ (a_0b_3 + a_1b_2 + a_2b_1 + a_2b_4 + a_3b_0 + a_3b_3 + a_4b_2 + a_4b_4) \cdot x^3 \\
&+ (a_0b_2 + a_1b_1 + a_1b_4 + a_2b_0 + \\
&\quad a_2b_3 + a_3b_2 + a_3b_4 + a_4b_1 + a_4b_3 + a_4b_4) \cdot x^2 \\
&+ (a_0b_1 + a_1b_0 + a_2b_4 + a_3b_3 + a_4b_2) \cdot x^1 \\
&+ (a_0b_0 + a_1b_4 + a_2b_3 + a_3b_2 + a_4b_1 + a_4b_4).
\end{aligned}$$

This relationship is realized by a Galois field multiplier having five first binary inputs, five second binary inputs and five binary outputs. This is explained in greater detail below.

The binary values $a_0$, $a_1$, $a_2$, $a_3$, $a_4$ are present at the first five inputs of the Galois field multiplier and the binary values $b_0$, $b_1$, $b_2$, $b_3$, $b_4$ are present at the second five inputs, while the values $c_0$, $c_1$, $c_2$, $c_3$, $c_4$ where $(a_0b_0+a_1b_4+a_2b_3+a_3b_2+a_4b_1+a_4b_4)=c_0$, (22)

$(a_0b_1+a_1b_0+a_2b_4+a_3b_3+a_4b_2)=c_1$ (23)

$(a_0b_2+a_1b_1+a_1b_4+a_2b_0+a_2b_3+a_3b_2+a_3b_4+a_4b_1+a_4b_3+a_4b_4)=c_2$ (24)

$(a_0b_3+a_1b_2+a_2b_1+a_2b_4+a_3b_0+a_3b_3+a_4b_2+a_4b_4)=c_3$ (25)

$(a_0b_4+a_1b_3+s_2b_2+a_3b_1+a_3b_4+a_4b_0+a_4b_3)=c_4$ (26)

are output at the five binary outputs. In this case, the symbol "+" denotes addition modulo 2 (XOR operation).

The implementation of equations (22) to (26) can be carried out by means of a Galois field multiplier, for example using AND gates and XOR gates (exclusive-OR gates). By way of example, a synthesis tool can also be used in the context of the implementation.

If an element of the Galois field is squared, it is to be multiplied by itself. If, in the polynomial representation, an element is given as a polynomial $a(x)=a_0+a_1x^1+a_2x^2+a_3x^3+a_4x^4$ the following holds true $$\begin{aligned}
(a(x))^2 \bmod m(x) &= \\
&= [a_0 + a_1x^2 + a_2x^4 + a_3x^6 + a_4x^8] \bmod (1 + x^2 + x^5) = \\
&= (a_2)x^4 + (a_3 + a_4)x^3 + (a_1 + a_4)x^2 + a_3x^1 + (a_0 + a_4).
\end{aligned}$$

Squaring an element in the Galois field $GF(2^5)$ can correspondingly be realized by a squarer having five binary inputs and five binary outputs. The binary values $a_0$, $a_1$, $a_2$, $a_3$, $a_4$ are fed in at its five binary inputs and the binary values $d_0$, $d_1$, $d_2$, $d_3$, $d_4$ are provided at the five binary outputs. The following holds true $a_0+a_4=d_0$, (27)

$a_3=d_1$, (28)

$a_1+a_4=d_2$, (29)

$a_3+a_4=d_3$, (30)

$a_2=d_4$, (31)

where the symbol "+" once again denotes addition modulo 2 (XOR operation).

In order to realize a squarer in the Galois field $GF(2^5)$ with the modular polynomial $m(x)=1+x^2+x^5$, equations (27) to (31) can be implemented by means of XOR gates, for example.

On the basis of the example of the Galois field $GF(2^5)$ a description is given of how the third power of an element which is specified in its polynomial representation can be determined.

If the third power $(a(x))^3$ of a polynomial $a(x)+a_0+a_1x^1+a_2x^2+a_3x^3+a_4x^4$ is determined modulo the modular polynomial $m(x)=1+x^2+x^5$, the following holds true:

$$\begin{aligned}
(a(x))^3 \bmod m(x) &= \\
&= (a_0a_2 + a_0a_4 + a_1a_2 + a_1a_3 + a_1a_4 + a_2a_3 + a_2a_4 + a_3 + a_3a_4) \cdot x^4 \\
&+ (a_0a_4 + a_1 + a_2 + a_2a_3 + a_2a_4 + a_3 + a_4) \cdot x^3 \\
&+ (a_0a_1 + a_0a_2 + a_0a_4 + a_1a_2 + a_2a_4 + a_3a_4 + a_4) \cdot x^2 \\
&+ (a_0a_1 + a_0a_3 + a_2 + a_3 + a_3a_4 + a_4) \cdot x^1 \\
&+ (a_0 + a_0a_4 + a_1a_2 + a_1a_3 + a_2a_3)
\end{aligned}$$

Forming the third power of an element in the Galois field $GF(2^5)$ can correspondingly be realized by a third power forming unit having five binary inputs and five binary outputs. The binary values $a_0$, $a_1$, $a_2$, $a_3$, $a_4$ are fed to the five binary inputs and the binary values $f_0$, $f_1$, $f_2$, $f_3$, $f_4$ are provided at the five binary outputs. The following holds true:

$f_0=a_0+a_0a_4+a_1a_2+a_1a_3+a_2a_3$ (32)

$f_1=a_0a_1+a_0a_3+a_2+a_3+a_3a_4+a_4$ (33)

$f_2=a_0a_1+a_0a_2+a_0a_4+a_1a_2+a_2a_4+a_3a_4+a_4$ (34)

$f_3=a_0a_4+a_1+a_2+a_2a_3+a_2a_4+a_3+a_4$ (35)

$f_4=a_0a_2+a_0a_4+a_1a_2+a_1a_3+a_1a_4+a_2a_3+a_2a_4+a_3+a_3a_4$ (36)

By way of example, a third power forming unit can be realized, in the present example in the Galois field $GF(2^5)$ with the modular polynomial $m(x)=1+x^2+x^5$, by merely implementing equations (32) to (36).

Alternatively, a third power forming unit can be realized from a squarer and a Galois field multiplier connected downstream. Moreover, higher powers of the element $a(x)$ can be realized in a corresponding manner using suitable components.

An implementation of a constant multiplier in the Galois field $GF(2^m)$ is illustrated below by way of example for m=5. The modular polynomial is $m(x)+1+x^2+x^5$.

Let $a \in GF(2^5)$ be an arbitrary element of the Galois field with the following polynomial representation $a(x)=a_0+a_1x+a_2x^2+a_3x^3+a_4x^4$. (37)

As a constant to be multiplied, $\alpha^9$ is chosen by way of example, the polynomial representation of which is given in accordance with the table shown in FIG. 13 by $\alpha^9(x)+x+x^3+x^4$ (38)

As multiplication the following arises $$a(x) \cdot \alpha^9(x) \bmod (1+x^2+x^5) = b_0 + b_1 x + b_2 x^2 + b_3 x^3 + b_4 x^4 \quad (39)$$

where $$b_0 = a_1 + a_2, \quad (40)$$

$$b_1 = a_0 + a_2 + a_3, \quad (41)$$

$$b_2 = a_2 + a_3 + a_4, \quad (42)$$

$$b_3 = a_0 + a_3 + a_4, \quad (43)$$

$$b_4 = a_0 + a_1 + a_4, \quad (44)$$

The output values $b_0, \ldots, b_4$ are derived from the input values $a_0, \ldots, a_4$ in accordance with the relationships represented in equations (40) to (44), such that the output values are determined from the input values by XOR operations. In this case, the symbol "+" denotes addition modulo 2 (XOR operation). Accordingly, the constant multiplier can be realized by means of XOR gates.

Description of a Byte Error Position Signal Forming Unit for Forming Byte Error Position Signals FIG. 1 shows an exemplary circuit arrangement for determining byte error position signals. A 2-byte-error-correcting error code having code words composed of n bytes is considered by way of example, where each byte has in each case m bits.

The circuit arrangement has N byte error position signal forming units $10, 11, \ldots, 1i, \ldots, 1N-1$, which provide byte error position signals $BPs_0, BPs_1, \ldots, BPs_i, \ldots, BPs_{N-1}$ via their respective 1-bit-wide output.

At respective 4·m-bit-wide inputs of the N byte error position signal forming units $10, 11, \ldots, 1i, \ldots, 1N-1$, a 4·m bit-wide error syndrome $$s = s_1, s_2, s_3, s_4$$

provided by a syndrome generator (not illustrated in FIG. 1) is present, which consists of the respective m-bit-wide syndrome components $s_1, s_2, s_3, s_4$.

If all bytes are corrected in the case of an error, then N=n holds true. If fewer than n bytes are corrected in the case of an error, N<n holds true. By way of example, it is possible that only data bytes are corrected in the case of an error. Check bytes could not then be corrected in such an example.

The byte error position signal forming unit 10 is configured for example such
that it outputs the byte error position signal $BPs_0 = 1$ if the following holds true:

$$\alpha^{2 \cdot 0}\{s_1 s_3 + s_2^2\} + \alpha^0 \{s_1 s_4 + s_2 s_3\} + s_2 s_4 + s_3^2 = 0$$

that it outputs the byte error position signal $BPs_0 = 0$ if the following holds true:

$$\alpha^{2 \cdot 0}\{s_1 s_3 + s_2^2\} + \alpha^0 \{s_1 s_4 + s_2 s_3\} + s_2 s_4 + s_3^2 \neq 0$$

The byte error position signal forming unit 11 is configured for example such
that it outputs the byte error position signal $BPs_i = 1$ if the following holds true:

$$\alpha^{2 \cdot 1}\{s_1 s_3 + s_2^2\} + \alpha^1 \{s_1 s_4 + s_2 s_3\} + s_2 s_4 + s_3^2 = 0$$

that it outputs the byte error position signal $BPs_i = 0$ if the following holds true:

$$\alpha^{2 \cdot 1}\{s_1 s_3 + s_2^2\} + \alpha^1 \{s_1 s_4 + s_2 s_3\} + s_2 s_4 + s_3^2 \neq 0$$

The byte error position signal forming unit 11 is configured for example such
that it outputs the byte error position signal $BPs_i = 1$ if the following holds true:

$$\alpha^{2 \cdot i}\{s_1 s_3 + s_2^2\} + \alpha^i \{s_1 s_4 + s_2 s_3\} + s_2 s_4 + s_3^2 = 0$$

that it outputs the byte error position signal $BPs_i = 0$ if the following holds true:

$$\alpha^{2 \cdot i}\{s_1 s_3 + s_2^2\} + \alpha^i \{s_1 s_4 + s_2 s_3\} + s_2 s_4 + s_3^2 \neq 0$$

The byte error position signal forming unit 1N−1 is configured for example such
that it outputs the byte error position signal $BPs_{N-1} = 1$ if the following holds true:

$$\alpha^{2 \cdot (N-1)}\{s_1 s_3 + s_2^2\} + \alpha^{N-1} \{s_1 s_4 + s_2 s_3\} + s_2 s_4 + s_3^2 = 0$$

that it outputs the byte error position signal $BPs_{N-1} = 0$ if the following holds true:

$$\alpha^{2 \cdot (N-1)}\{s_1 s_3 + s_2^2\} + \alpha^{(N-1)} \{s_1 s_4 + s_2 s_3\} + s_2 s_4 + s_3^2 = 0$$

In this case, the respective exponents of a are to be interpreted modulo $2^m - 1$.

If a 2-byte error is present and if the j-th byte and the k-th byte are erroneous, then for i=j and for i=k the byte error position signals $BPs_i$ are equal to 1, while all other byte error position signals $BPs_l$ where $l \neq j, k$ are equal to 0, where the following holds true:

$$0 \leq i, j, k, l \leq N-1,$$

$\alpha^0 = 1$ and 1 is the unity of the Galois field $GF(2^m)$.

FIG. 1A shows a simplified schematic diagram of an example embodiment of a device 190 implementing the error-correcting circuit arrangement of FIG. 1. The device 190 comprises a memory 191 connected to an error-correcting circuit arrangement 192. The memory 191 may comprise, for example, MRAM or SRAM memory cells, as described above. The error-correcting circuit arrangement 192 may correspond, for example, to the above-described error-correcting circuit arrangement of FIG. 1 or the below-described error-correcting circuit arrangements of any of FIGS. 2-12.

Figure 2:
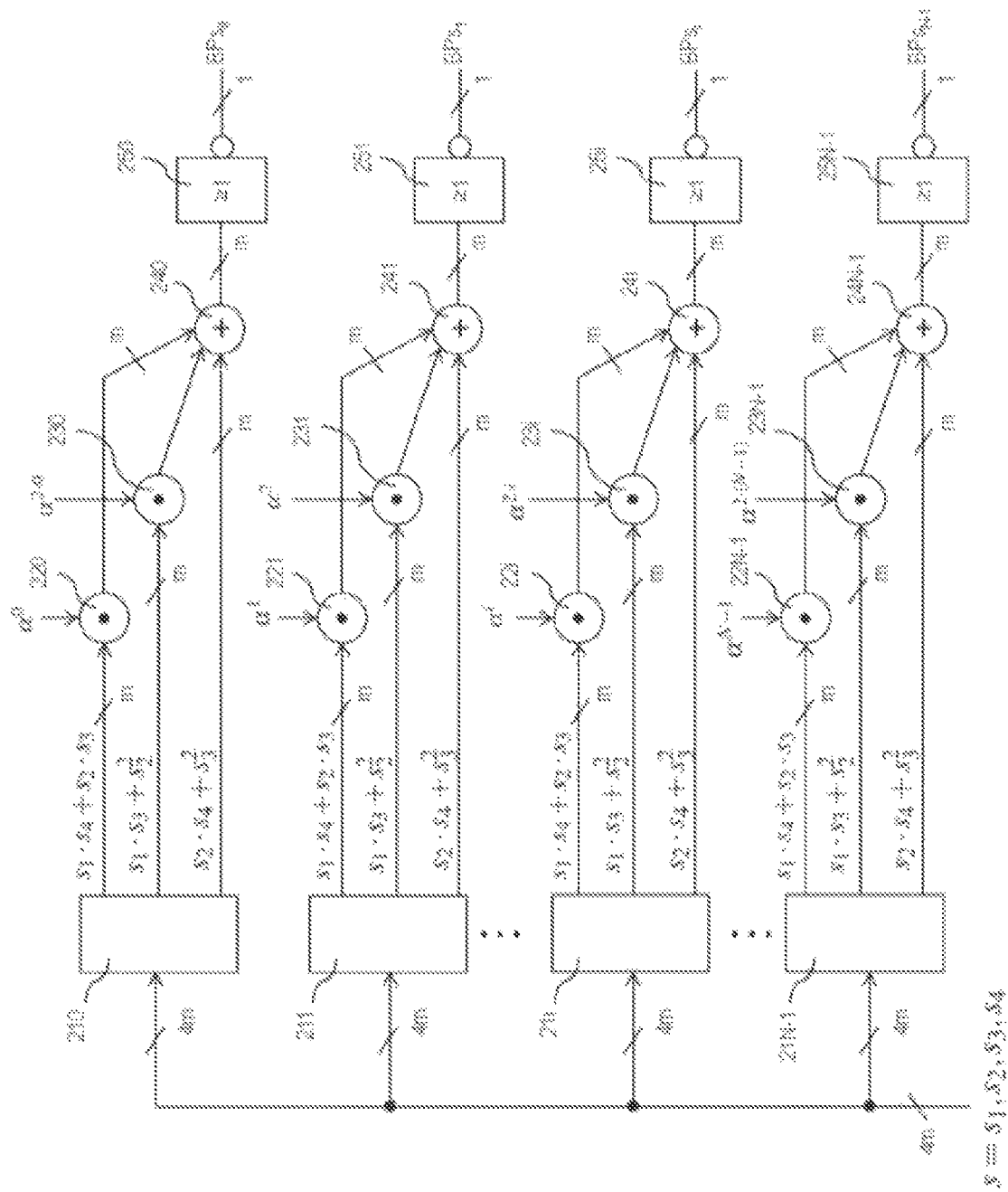
FIG. 2 shows an alternative embodiment of the circuit arrangement shown in FIG. 1.

Byte Error Position Signal Forming Unit in Accordance with FIG. 2

FIG. 2 shows a circuit arrangement which represents one possible embodiment of the circuit arrangement shown in FIG. 1.

The byte error position signal forming unit 10 shown in FIG. 1 comprises
a subcircuit 210 having a 4·m-bit-wide input for inputting the components $s_1, s_2, s_3$ and $s_4$ of the error syndrome $s = s_1, s_2, s_3, s_4$ and three respective m-bit-wide outputs,
a constant multiplier 220 having a first m-bit-wide input, a second m-bit-wide input and an m-bit-wide output,
a constant multiplier 230 having a first m-bit-wide input, a second m-bit-wide input and an m-bit-wide output,
an XOR circuit 240 having three respective m-bit-wide inputs and an m-bit-wide output, and
a NOR circuit 250 (NOT-OR circuit) having an m-bit-wide input and a 1-bit-wide binary output.

The subcircuit 210 is configured in such a way that upon the error syndrome s being input, it
outputs $s_1 \cdot s_4 + s_2 \cdot s_3$ at the first output,
outputs $s_1 \cdot s_3 + s_2^2$ at the second output and
outputs $s_2 \cdot s_4 + s_3^2$ at the third output.

The first output of the subcircuit 210 is connected to the first input of the constant multiplier 220. The constant $\alpha^0 = 1$ is present at the second input of the constant multiplier 220, such that $$\alpha^0 (s_1 \cdot s_4 + s_2 \cdot s_3) = s_1 \cdot s_4 + s_2 \cdot s_3$$

is provided at the output of the constant multiplier 220.

The output of the constant multiplier 220 is connected to the first input of the XOR circuit 240.

The second output of the subcircuit 210 is connected to the first input of the constant multiplier 230. The constant $\alpha^{2 \cdot 0} = \alpha^0$ is present at the second input of the constant multiplier 230, such that $$\alpha^0(s_1 \cdot s_3 + s_2^2) = s_1 \cdot s_3 + s_2^2$$

is provided at the output of the constant multiplier 230.

The output of the constant multiplier 230 is connected to the second input of the XOR circuit 240.

The third output of the subcircuit 210 is connected to the third input of the XOR circuit 240.

The XOR circuit 240 forms for example a component-by-component XORing of the respective m-bit-wide values present at its three inputs and provides the value $$v^0 = \alpha^0(s_1 \cdot s_4 + s_2 \cdot s_3) + \alpha^0(s_1 \cdot s_3 + s_2^2) + s_2 \cdot s_4 + s_3^2$$

at its m-bit-wide output, this value being passed to the input of the NOR circuit 250. The NOR circuit 250 provides at its output the binary value $BPs_0 = 1$ if $v^0 = 0$ holds true and
the binary value $BPs_0 = 0$ if $v^0 \neq 0$ holds true.

The byte error position signal forming unit 11 shown in FIG. 1 comprises
 a subcircuit 211 having a 4·m-bit-wide input for inputting the components $s_1, s_2, s_3, s_4$ of the error syndrome $s = s_1, s_2, s_3, s_4$ and three respective m-bit-wide outputs,
 a constant multiplier 221 having a first m-bit-wide input, a second m-bit-wide input and an m-bit-wide output,
 a constant multiplier 231 having a first m-bit-wide input, a second m-bit-wide input and an m-bit-wide input,
 an XOR circuit 241 having three respective m-bit-wide inputs and an m-bit-wide output, and
 a NOR circuit 251 having an m-bit-wide input and a 1-bit-wide binary output.

The subcircuit 211 is configured in such a way that, upon the error syndrome s being input, it
 outputs $s_1 \cdot s_4 + s_2 \cdot s_3$ at the first output,
 outputs $s_1 \cdot s_3 + s_2^2$ at the second output and
 outputs $s_2 \cdot s_4 + s_3^2$ at the third output.

The first output of the subcircuit 211 is connected to the first input of the constant multiplier 221. The constant $\alpha^1$ is present at the second input of the constant multiplier 221, such that is provided at the output of the constant multiplier 221.

The output of the constant multiplier 221 is connected to the first input of the XOR circuit 241.

The second output of the subcircuit 211 is connected to the first input of the constant multiplier 231. The constant $\alpha^2$ is present at the second input of the constant multiplier 231, such that $$\alpha^2(s_1 \cdot s_3 + s_2^2)$$

is provided at the output of the constant multiplier 231.

The output of the constant multiplier 231 is connected to the second input of the XOR circuit 241.

The third output of the subcircuit 211 is connected to the third input of the XOR circuit 241.

The XOR circuit 241 forms for example a component-by-component XORing of the respective m-bit-wide values present at its three inputs and provides the value $$v^1 = \alpha^1(s_1 \cdot s_4 + s_2 \cdot s_3) + \alpha^2(s_1 \cdot s_3 + s_2^2) + s_2 \cdot s_4 + s_3^2$$

at its m-bit-wide output, this value being passed to the input of the NOR circuit 251. The NOR circuit 251 provides at its output the binary value $BPs_1 = 1$ if $v^1 = 0$ holds true
the binary value $BPs_1 = 0$ if $v^1 \neq 0$ holds true.

The byte error position signal forming unit 1i shown in FIG. 1 comprises
 a subcircuit 21i having a 4·m-bit-wide input for inputting the components $s_1, s_2, s_3$ and $s_4$ of the error syndrome $s = s_1, s_2, s_3, s_4$ and three respective m-bit-wide outputs,
 a constant multiplier 22i having a first m-bit-wide input, a second m-bit-wide input and an m-bit-wide output,
 a constant multiplier 23i having a first m-bit-wide input, a second m-bit-wide input and an m-bit-wide output,
 an XOR circuit 24i having three respective m-bit-wide inputs and an m-bit-wide output, and
 a NOR circuit 25i having an m-bit-wide input and a 1-bit-wide binary output.

The subcircuit 21i is configured in such a way that, upon the error syndrome s being input, it
 outputs $s_1 \cdot s_4 + s_2 \cdot s_3$ at the first output,
 outputs $s_1 \cdot s_3 + s_2^2$ at the second output and
 outputs $s_2 \cdot s_4 + s_3^2$ at the third output.

The first output of the subcircuit 21i is connected to the first input of the constant multiplier 22i. The constant $\alpha^i$ is present at the second input of the constant multiplier 22i, such that $$\alpha^i(s_1 \cdot s_4 + s_2 \cdot s_3)$$

is provided at the output of the constant multiplier 22i.

The output of the constant multiplier 22i is connected to the first input of the XOR circuit 24i.

The second output of the subcircuit 21i is connected to the first input of the constant multiplier 23i. The constant $\alpha^{2 \cdot i}$ is present at the second input of the constant multiplier 23i, such that $$\alpha^{2 \cdot i}(s_1 \cdot s_3 + s_2^2)$$

is provided at the output of the constant multiplier 23i.

The output of the constant multiplier 23i is connected to the second input of the XOR circuit 24i.

The third output of the subcircuit 21i is connected to the third input of the XOR circuit 24i.

The XOR circuit 24i forms for example a component-by-component XORing of the respective m-bit-wide values present at its three inputs and provides at its m-bit-wide output $$v^i = \alpha^i(s_1 \cdot s_4 + s_2 \cdot s_3) + \alpha^{2 \cdot i}(s_1 \cdot s_3 + s_2^2) + s_2 \cdot s_4 + s_3^2$$

which is passed to the input of the NOR circuit 25i. The NOR circuit 25i provides at its output
 the binary value $BPs_i = 1$ if $v^i = 0$ holds true and
 the binary value $BPs_i = 0$ if $v^i \neq 0$ holds true.

Exemplary Combination of the Subcircuits

The byte error position signal forming unit 1N−1 shown in FIG. 1 comprises
 a subcircuit 21N−1 having a 4·m-bit-wide input for inputting the components $s_1, s_2, s_3$ and $s_4$ of the error syndrome $s = s_1, s_2, s_3, s_4$ and three respective m-bit-wide outputs,
 a constant multiplier 22N−1 having a first m-bit-wide input, a second m-bit-wide input and an m-bit-wide output,
 a constant multiplier 23N−1 having a first m-bit-wide input, a second m-bit-wide input and an m-bit-wide output,
 an XOR circuit 24N−1 having three respective m-bit-wide inputs and an m-bit-wide output, and
 a NOR circuit 25N−1 having an m-bit-wide input and a 1-bit-wide binary output.

The subcircuit 21N−1 is configured in such a way that, upon the error syndrome s being input, it outputs $s_1 \cdot s_4 + s_2 \cdot s_3$ at the first output,
outputs $s_1 \cdot s_3 + s_2^2$ at the second output and
outputs $s_2 \cdot s_4 + s_3^2$ at the third output.

The first output of the subcircuit 21N−1 is connected to the first input of the constant multiplier 22N−1. The constant $\alpha^{N-1}$ present at the second input of the constant multiplier 22N−1, such that $$\alpha^{N-1}(s_1 \cdot s_4 + s_2 \cdot s_3)$$

is provided at the output of the constant multiplier 22N−1.

The output of the constant multiplier 22N−1 is connected to the first input of the XOR circuit 24N−1.

The second output of the subcircuit 21N−1 is connected to the first input of the constant multiplier 23N−1. The constant $\alpha_{2 \cdot (N-1)}$ is present at the second input of the constant multiplier 23N−1, such that $$\alpha^{2 \cdot (N-1)}(s_1 \cdot s_3 + s_2^2)$$

is provided at the output of the constant multiplier 23N−1.

The output of the constant multiplier 23N−1 is connected to the second input of the XOR circuit 24N−1.

The third output of the subcircuit 21N−1 is connected to the third input of the XOR circuit 24N−1.

The XOR circuit 24N−1 forms for example a component-by-component XORing of the respective m-bit-wide values present at its three inputs and provides the value $$v^{N-1} = \alpha^{N-1}(s_1 \cdot s_4 + s_2 \cdot s_3) + \alpha^{2 \cdot (N-1)}(s_1 \cdot s_3 + s_2^2) + s_2 \cdot s_4 + s_3^2$$

at its m-bit-wide output, this value being passed to the input of the NOR circuit 25N−1. The NOR circuit 25N−1 provides at its output the binary value $BPs_{N-1} = 1$ if $v^{N-1} = 0$ holds true and
the binary value $BPs_{N-1} = 0$ if $v^{N-1} \neq 0$ holds true.

Exemplary Combination of the Subcircuits

The subcircuits 210, 211, . . . , 21i, . . . , 21N−1 in FIG. 2 are functionally identical. It is thus possible for these subcircuits to be combined in one subcircuit 31.

Figure 3:
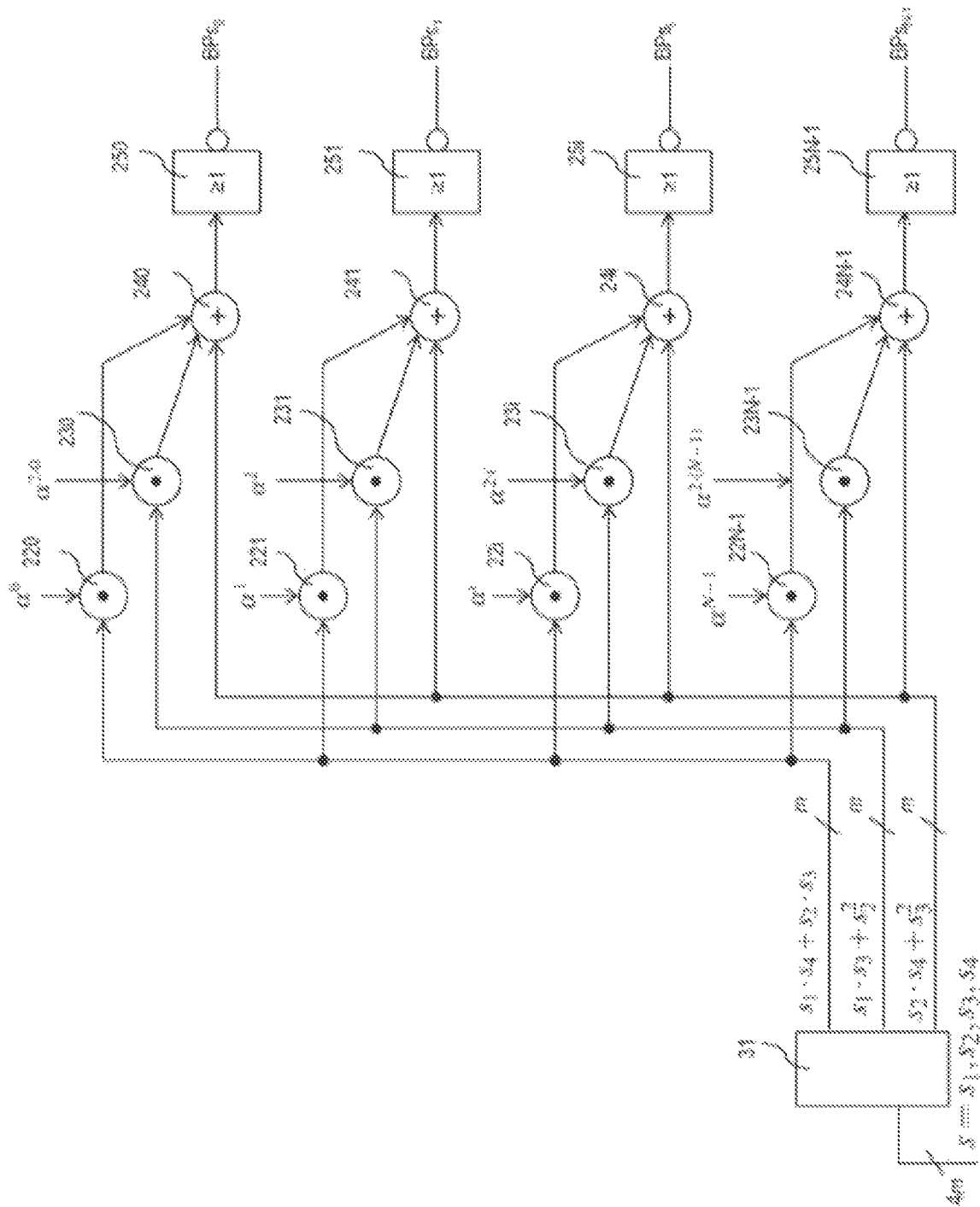
FIG. 3 shows a further embodiment of the circuit arrangement shown in FIG. 1, comprising a central circuit part.

FIG. 3 shows such a subcircuit 31 that combines the subcircuits 210, 211, . . . , 21i, . . . , 21N−1. The remaining circuit part shown in FIG. 3 is identical to FIG. 2.

By way of example, the byte error position signal forming units 10, 11, . . . , 1i, . . . 1N−1 in accordance with FIG. 1 can utilize the common subcircuit 31.

Exemplary Implementation of the Subcircuit 31

Figure 4:
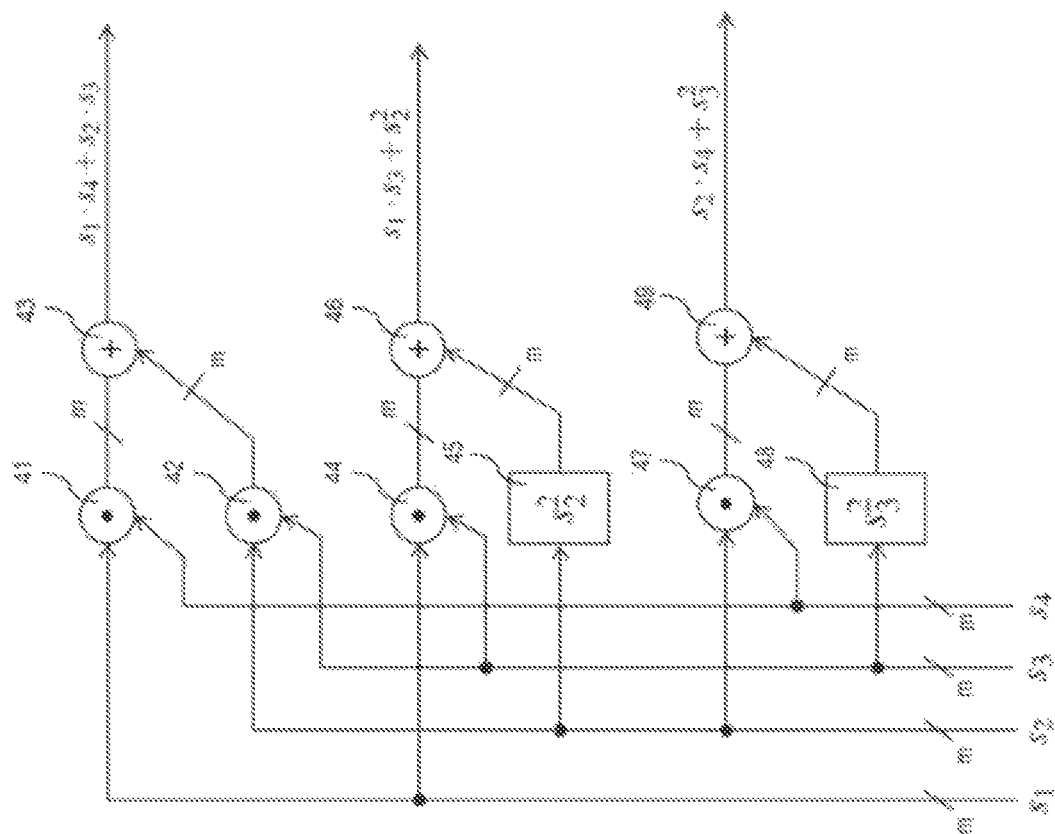
FIG. 4 shows an alternative exemplary realization of the central circuit part shown in FIG. 3.

FIG. 4 shows one possible implementation of the subcircuit 31 illustrated in FIG. 3.

The subcircuit 31 has four respective m-bit-wide inputs for inputting the components $s_1$, $s_2$, $s_3$, $s_4$ which form the syndrome s. Furthermore, provision is made of four multipliers 41, 42, 44 and 47 each having two m-bit-wide inputs and an m-bit-wide output, two squarers 45 and 48 each having an m-bit-wide input and an m-bit-wide output, and three XOR circuits 43, 46 and 49 each having two m-bit-wide inputs and an m-bit-wide output.

The XOR circuits 43, 46, 49 each carry out a component-by-component XORing of the m-component values present at their respective inputs. The multipliers carry out a multiplication in the Galois field $GF(2^m)$, and the squarers square their operands present at the input likewise in the Galois field $GF(2^m)$.

The input carrying the component $s_1$ is connected to the first input of the multiplier 41 and to the first input of the multiplier 44.

The input carrying the component $s_2$ is connected to the first input of the multiplier 42, to the first input of the multiplier 47 and to the input of the squarer 45.

The input carrying the component $s_3$ is connected to the second input of the multiplier 42, to the second input of the multiplier 44 and to the input of the squarer 48.

The input carrying the component $s_4$ is connected to the second input of the multiplier 41 and to the second input of the multiplier 47.

The output of the multiplier 41 is passed into the first input of the XOR circuit 43. The output of the multiplier 42 is passed into the second input of the XOR circuit 43. The signal $s_1 s_4 + s_2 s_3$ is provided at the output of the XOR circuit 43.

The output of the multiplier 44 is passed into the first input of the XOR circuit 46. The output of the squarer 45 is connected to the second input of the XOR circuit 46. The signal $s_1 s_3 + s_2^2$ is provided at the output of the XOR circuit 46.

The output of the multiplier 47 is passed into the first input of the XOR circuit 49. The output of the squarer 48 is connected to the second input of the XOR circuit 49. The signal $s_2 s_4 + s_3^2$ is provided at the output of the XOR circuit 49.

Byte Error Correction Values for 2-Byte Errors

Figure 5:
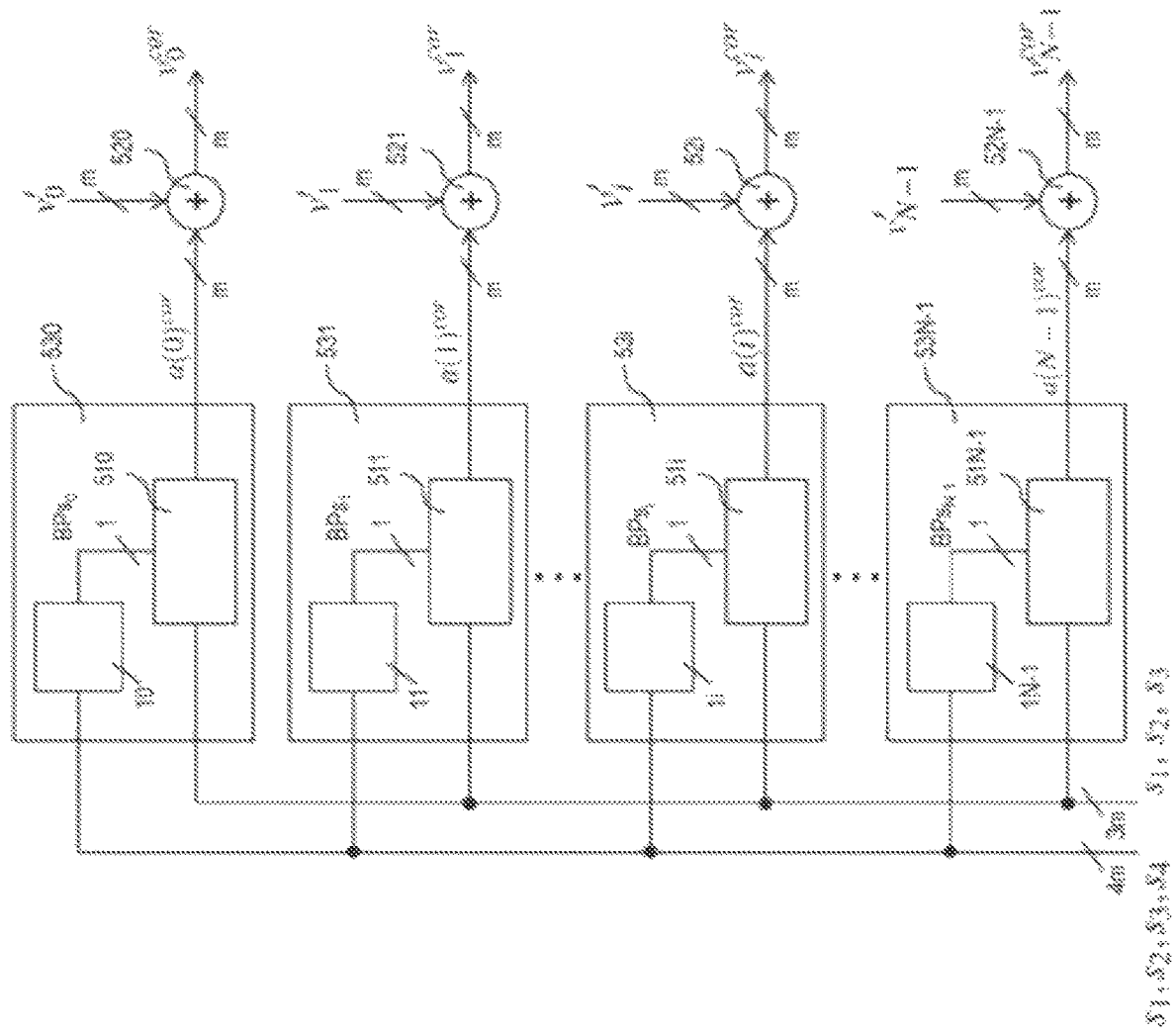
FIG. 5 shows an example of a circuit arrangement for the byte error correction of 2-byte errors.

FIG. 5 shows an exemplary circuit for forming byte error correction values for a total of N bytes in the case of a 2-byte error. The N bytes considered are numbered from 0 to N−1.

A byte error correction value $a(i)^{cor}$ for the i-th byte where $0 \leq i \leq N-1$ is determined depending on the current error syndrome s, the byte position i and the byte error position signal $BPs_i$ in accordance with $$a(i)^{cor} = BPs_i \cdot a(i).$$

By way of example, byte error correction values are determined for all N byte positions. The byte error correction values are masked for byte positions which are not erroneous. By way of example, the masking can be carried out by multiplying a byte error position signal having the value 0 by the byte error correction value.

If a 2-byte error is present in the byte positions i and j, the i-th and j-th bytes can be corrected by the i-th and j-th bytes being XORed component by component with a corresponding byte error correction value $a(i)^{cor} = a(i) \neq 0$ and respectively $a(j)^{cor} = a(j) \neq 0$.

The bytes which are not erroneous are not corrected. For this purpose, for their byte positions the byte error correction values are set to 0 (e.g., by means of the above-explained multiplication of the byte error correction value by 0) and the correct bytes are then XORed component by component with this value 0. As a result of the XORing with the value 0, the original value remains unchanged.

For the i-th erroneous byte the byte error position signal $BPs_i = 1$ and the following holds true:

$$a(i)^{cor} = BPs_i \cdot a(i) = a(i).$$

For the j-th erroneous byte the byte error position signal $BPs_j = 1$ and the following holds true:

$$a(j)^{cor} = BPs_j \cdot a(j) = a(j).$$

For a k-th, non-erroneous byte where $k \neq i, j$, the byte error position signal $BPs_k = 0$ and the following holds true:

$$a(k)^{cor} = BPs_k \cdot a(k) = 0.$$

If the k-th byte where $k \neq i, j$ is not erroneous, it is not corrected. In accordance with the example shown in FIG. 5 this can be achieved by the k-th byte being XORed component by component with the value 0, such that the value of the k-th byte does not change. The byte error position signal thus masks the byte error correction value as 0, such that no correction is carried out.

If, in the case of a 2-byte error, a first byte error is present in the byte position j and a second byte error is present in the byte position k, the byte error correction values $a(j)^{cor}$ and $a(k)^{cor}$ are not equal to 0, while the byte error correction values $a(i)^{cor}$ for $i \neq j,k$ are in each case equal to 0. It then also holds true that $$BPs_j = BPs_k = 1$$

and $$BPs_i = 0 \text{ for } i \neq j,k.$$

FIG. 5 comprises N byte error position signal forming units 10, 11, ..., 1i, ..., 1N−1 for forming the byte error position signals $BPs_0$, $BPs_i$, ..., $BPs_j$, ..., $BPs_{N-1}$ each having a 4·m-bit-wide (or a 4·m-dimensional) input for inputting the error syndrome s and a 1-bit-wide (or 1-dimensional) output for outputting the byte error position signals $BPs_0$, $BPs_i$, ..., $BPs_j$, ..., $BPs_{N-1}$.

FIG. 5 furthermore shows N byte error correction value forming units 510, 511, ..., 51i, ..., 5N−1 each having
- a first 1-bit-wide input for inputting a byte error position signal,
- a second 3·m-bit-wide input for inputting the components $s_1$, $s_2$, $s_3$ of the error syndrome s and
- an m-bit-wide output for outputting one of the byte error correction values $a(0)^{cor}$, $a(2)^{cor}$, ... $a(i)^{cor}$, ..., $a(N-1)^{cor}$ for the corresponding byte positions.

Furthermore, FIG. 5 comprises NXOR circuits 520, 521, ..., 52i, ..., 52N−1 each having
- an m-bit-wide first input for inputting the corresponding byte error correction value,
- a second m-bit-wide input for inputting the corresponding byte to be corrected, and
- an m-bit-wide output for outputting the respective m-bit-wide corrected bytes.

The current error syndrome s is present at the 4·m-bit-wide input of the byte error position signal forming unit 10. The byte error position signal $BPs_0$ is output at the 1-bit-wide output of the byte error position signal forming unit 10, which is connected to the first input of the byte error correction value forming unit 510.

The components $s_1$, $s_2$, $s_3$ of the error syndrome s are present at the second 3·m-bit-wide input of the byte error correction value forming unit 510. The byte error correction value forming unit 510 provides the byte error correction value $a(0)^{cor}$ at its output. The output of the byte error correction value forming unit 510 is connected to the first input of the XOR circuit 520. The possibly erroneous byte value $v_0'$ of the 0-th byte is present at the second input of the XOR circuit 520. The XOR circuit 520 forms the component-by-component XORing of the possibly erroneous byte value $v_0'$ and the byte error correction value $a(0)^{cor}$ and outputs the value $$v_0' + a(0)^{cor} = v_0^{cor}$$

at its output. The byte error correction value $a(0)^{cor}$
is equal to 0 if the 0-th byte is correct and $BPs_0 = 0$, and
is not equal to 0 if the 0-th byte is erroneous and $BPs_0 = 1$.

The current error syndrome s is present at the 4·m-bit-wide input of the byte error position signal forming unit 11. The byte error position signal $BPs_i$ is output at the 1-bit-wide output of the byte error position signal forming unit 11, which is connected to the first input of the byte error correction value forming unit 511.

The components $s_1$, $s_2$, $s_3$ of the error syndrome s are present at the second 3·m-bit-wide input of the byte error correction value forming unit 511. The byte error correction value forming unit 511 provides the byte error correction value $a(1)^{cor}$ at its output. The output of the byte error correction value forming unit 511 is connected to the first input of the XOR circuit 521. The possibly erroneous byte value $v_1'$ of the 1-th byte is present at the second input of the XOR circuit 521. The XOR circuit 521 forms the component-by-component XORing of the possibly erroneous byte value $v_1'$ and the byte error correction value $a(1)^{cor}$ and outputs the value $$v_1' + a(1)^{cor} = v_1^{cor}$$

at its output. The byte error correction value $a(1)^{cor}$
is equal to 0 if the 1-st byte is correct and $BPs_i = 0$, and
is not equal to 0 if the 1-st byte is erroneous and $BPs_i = 1$.

The current error syndrome s is present at the 4·m-bit-wide input of the byte error position signal forming unit 1i. The byte error position signal $BPs_i$ is output at the 1-bit-wide output of the byte error position signal forming unit 1i, which is connected to the first input of the byte error correction value forming unit 51i.

The components $s_1$, $s_2$, $s_3$ of the error syndrome s are present at the second 3·m-bit-wide input of the byte error correction value forming unit 51i. The byte error correction value forming unit 51i provides the byte error correction value $a(i)^{cor}$ at its output. The output of the byte error correction value forming unit 51i is connected to the first input of the XOR circuit 52i. The possibly erroneous byte value $v_i'$ of the i-th byte is present at the second input of the XOR circuit 52i. The XOR circuit 52i forms the component-by-component XORing of the possibly erroneous byte value $v_i'$ and the byte error correction value $a(i)^{cor}$ and outputs the value $$v_1' + a(i)^{cor} = v_i^{cor}$$

at its output. The byte error correction value $a(i)^{cor}$
is equal to 0 if the i-th byte is correct and $BPs_i = 0$, and
is not equal to 0 if the i-th byte is erroneous and $BPs_i = 1$.

The current error syndrome s is present at the 4·m-bit-wide input of the byte error position signal forming unit 1N−1. The byte error position signal $BPs_{N-1}$ is output at the 1-bit-wide output of the byte error position signal forming unit 1N−1, which is connected to the first input of the byte error correction value forming unit 51N−1.

The components $s_1$, $s_2$, $s_3$ of the error syndrome s are present at the second 3·m-bit-wide input of the byte error correction value forming unit 51N−1. The byte error correction value forming unit 51N−1 provides the byte error correction value $a(N-1)^{COr}$ at its output. The output of the byte error correction value forming unit 51N−1 is connected to the first input of the XOR circuit 52N−1. The possibly erroneous byte value of the (N−1)-th byte is present at the second input of the XOR circuit 52N−1. The XOR circuit 52N−1 forms the component-by-component XORing of the possibly erroneous byte value and the byte error correction value $a(N-1)^{cor}$ and outputs the value $$v_{N-1}' + a(N-1)^{cor} = v_{N-1}^{cor}$$

at its output. The byte error correction value $a(N-1)^{cor}$
is equal to 0 if the (N−1)-th byte is correct and $BPs_{N-1} = 0$, and
is not equal to 0 if the (N−1)-th byte is erroneous and $BPs_{N-1} = 1$.

In this regard, a byte corrector 530 can comprise the byte error position signal forming unit 10 and the byte error correction value forming unit 510, a byte corrector 531 can comprise the byte error position signal forming unit 11 and the byte error correction value forming unit 511, a byte corrector 53*i* can comprise the byte error position signal forming unit 1*i* and the byte error correction value forming unit 51*i* and a byte corrector 53N−1 can comprise the byte error position signal forming unit 1N−1 and the byte error correction value forming unit 51N−1. Correspondingly, the byte correctors 530, 531, . . . , 53*i*, . . . , 53N−1 can be referred to as byte correctors for 2-byte errors.

In this example, the byte correctors for a 2-byte error output the byte error correction values for those two byte positions which are erroneous. For byte positions having no error, the byte error correction value is equal to 0.

For an erroneous byte position i it holds true that:

$$a(i)^{cor}=a(i).$$

For a byte position j that is not erroneous it holds true that:

$$a(j)^{cor}=0.$$

In this case, a(i) is the byte error correction value of the i-th byte.

In order to clearly illustrate that the byte error position signal forming units form the corresponding byte error position signal depending on the four components $s_1, s_2, s_3, s_4$ of the error syndrome s and that the byte error correction value forming units form the corresponding byte error correction value depending on the three components $s_1, s_2, s_3$ of said error syndrome s, FIG. 5 illustrates by way of example two input lines, an input line for inputting the components $s_1, s_2, s_3, s_4$ and a further input line for inputting the components $s_1, s_2, s_3$. These lines can also be combined for the components $s_1, s_2, s_3$.

For r=0, . . . , N−1, a byte error correction value forming unit 51*r* is configured such that it forms at its m-bit-wide output, which is connected to the first m-bit-wide input of an XOR circuit 52*r*, in the case of a 2-byte error, the byte error correction value such that the following holds true:

$$a(r)^{cor} = \frac{s_1 s_3 + s_2^2}{s_3 + \alpha^{2r} s_1} \cdot BP_{S_r}.$$

If, in the case of a 2-byte error, the j-th and k-th bytes are erroneous, the byte error correction value forming unit 51*j* outputs the byte error correction value $$a(j)^{cor} = \frac{s_1 s_3 + s_2^2}{s_3 + \alpha^{2j} s_1} = a(j)$$

and the byte error correction value forming unit 51*k* outputs the byte error correction value $$a(k)^{cor} = \frac{s_1 s_3 + s_2^2}{s_3 + \alpha^{2k} s_1} = a(k).$$

For all other byte error correction value forming units 51*r* where r≠j,k and 0≤r≤N−1, the byte error correction value is equal to $a(r)^{cor}=0$.

Byte Error Correction Value Forming Unit

Figure 6:
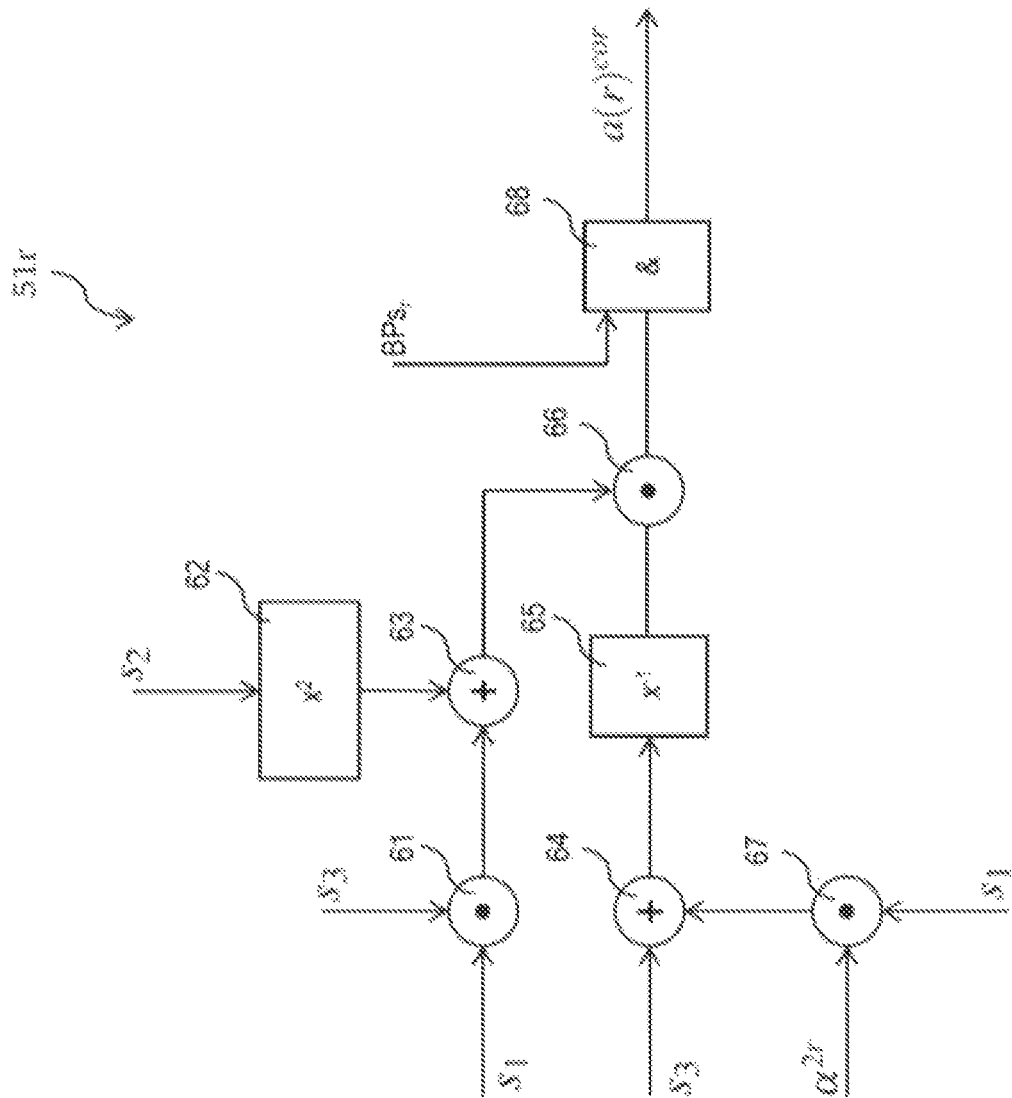
FIG. 6 shows an example of a realization of the partial circuit for forming the byte error correction value shown in FIG. 5.

FIG. 6 shows one possible embodiment of the byte error correction value forming unit 51*r*, wherein r can assume a value of 0 to N−1.

The byte error correction value forming unit 51*r* comprises two multipliers 61, 66 each having a first and a second m-bit-wide input and an m-bit-wide output, two XOR circuits 63, 64 each having a first m-bit-wide input, a second m-bit-wide input and an m-bit-wide output, a constant multiplier 67 having a first and a second m-bit-wide input and an m-bit-wide output, wherein a constant value $a^{2r}$ is present at the second input, a squarer 62 having an m-bit-wide input and an m-bit-wide output, an inverting circuit 65 having an m-bit-wide input and an m-bit-wide output, and an AND circuit 68 having a first 1-bit-wide input, a second m-bit-wide input and an m-bit-wide output.

The value of the component $s_1$ is present at the first input of the multiplier 61 and the value of the component $s_3$ is present at the second input of the multiplier 61. The multiplier 61 forms the value $s_1 \cdot s_3$ in the Galois field $GF(2^m)$ and outputs the value $s_1 \cdot s_3$ at its output. The output of the multiplier 61 is connected to the first input of the XOR circuit 63.

The second input of the XOR circuit 63 is connected to the output of the squarer 62, at the input of which the value of the component $s_2$ is present. Consequently, the squarer 62 outputs the value $s_2^2$ at its output. The XOR circuit 63 forms the component-by-component XORing of the values present at its two inputs and outputs the value $s_1 s_3 + s_2^2$ at its output. The output of the XOR circuit 63 is connected to the first input of the multiplier 66.

The value of the component $s_3$ is present at the first input of the XOR circuit 64. The value of the component $s_1$ is present at the first input of the constant multiplier 67 and the constant $\alpha^{2r}$ is present at the second input of the constant multiplier 67. The constant multiplier 67 realizes the operation $\alpha^{2r} \cdot s_1$ in the Galois field $GF(2^m)$. The constant multiplier can be implemented for example using XOR gates.

At the output of the XOR circuit 64, the value $s_3 + \alpha^{2r} s_1$ is provided and passed to the input of the inverter 65. The inverter 65 provides the value $$\frac{1}{s_3 + \alpha^{2r}}$$

at its output.

The output of the inverter 65 is connected to the first input of the multiplier 66. The multiplier 66 thus provides the value $$\frac{s_1 s_3 + s_2^2}{s_3 + \alpha^{2r} s_1} = a(r)$$

at its output. In this case, a(r) is the byte error correction value for the r-th byte. The value of the byte error position signal $BP_{S_r}$ is present at the first input of the AND circuit 68. The second input of the AND circuit 68 is connected to the output of the multiplier 66.

The AND circuit realizes a bit-by-bit ANDing of the m bits present at its two inputs with the byte error position signal $BP_{S_r}$, such that it provides the value $$\frac{s_1 s_3 + s_2^2}{s_3 + \alpha^{2r} s_1} \cdot BP_{S_r} = a(r) \cdot BP_{S_r} = a(r)^{cor}$$

at its output.

Byte Error Correction Value Forming Unit, Alternative Embodiment

Figure 7:
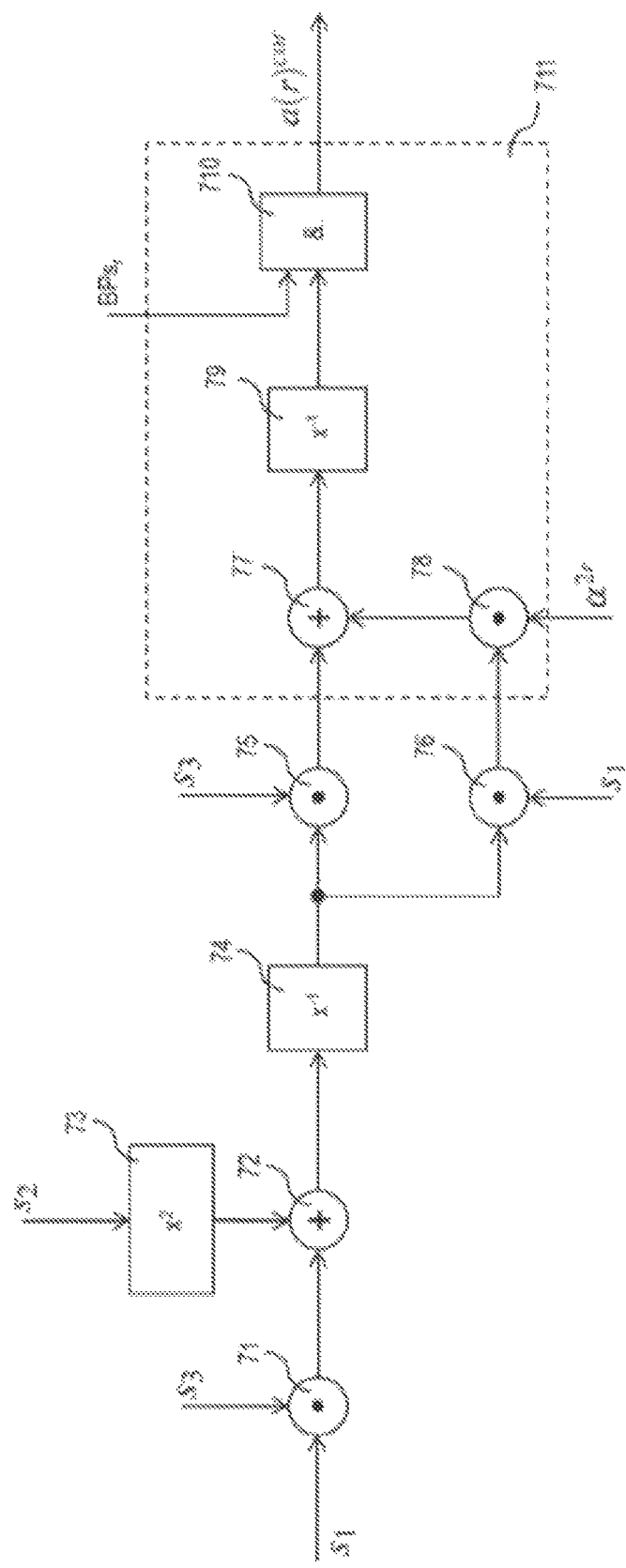
FIG. 7 shows a further example of a realization of the partial circuit for forming the byte error correction value shown in FIG. 5.

FIG. 7 shows a further possible embodiment of the byte error correction value forming unit 51r, which is described for the r-th byte as in FIG. 6, wherein r can assume a value of 0 to (N−1).

The byte error correction value forming unit 51r shown in FIG. 7 comprises

- three multipliers 71, 75, 76 each having a first m-bit-wide input, a second m-bit-wide input and an m-bit-wide output,
- two XOR circuits 72, 77 each having an m-bit-wide first input, an m-bit-wide second input and an m-bit-wide output,
- a constant multiplier 78 having a first m-bit-wide input, a second m-bit-wide input and an m-bit-wide output, wherein a constant value $\alpha^{2r}$ is present at the second input,
- a squarer 73 having an m-bit-wide input and an m-bit-wide output,
- two inverters 74, 79 each having an m-bit-wide input and an m-bit-wide output, and
- an AND circuit 710 having a first 1-bit-wide input, a second m-bit-wide input and an m-bit-wide output.

The value of the component $s_1$ is present at the first input of the multiplier 71 and the value of the component $s_3$ is present at the second input of the multiplier 71. The multiplier 71 forms the value $s_1 \cdot s_3$ in the Galois field GF($2^m$) and provides the value $s_1 \cdot s_3$ at its output. The output of the multiplier 71 is connected to the first input of the XOR circuit 72.

The second input of the XOR circuit 72 is connected to the output of the squarer 73, at the input of which the value of the component $s_2$ is present. The squarer 73 thus provides the value $s_2^2$ at its output. The XOR circuit 72 forms the component-by-component XORing of the values present at its two inputs and provides the value $s_1 s_3 + s_2^2$ at its output. The output of the XOR circuit 72 is connected to the input of the inverter 74. The inverter 74 provides the value $$\frac{1}{s_1 s_3 + s_2^2}$$

at its output.

The output of the inverter 74 is connected to the first input of the multiplier 75, at the second input of which the value of the component $s_3$ is present. Furthermore, the output of the inverter 74 is connected to the first input of the multiplier 76, at the second input of which the value of the component $s_1$ is present.

The multiplier 76 provides the value $$\frac{s_1}{s_1 s_3 + s_2^2}$$

at its output. The output of the multiplier 76 is connected to the first input of the constant multiplier 78. The value $\alpha^{2r}$ is present at the second input of the constant multiplier 78. The constant multiplier 78 provides the value $$\frac{\alpha^{2r} s_1}{s_1 s_3 + s_2^2}$$

at its output. The constant multiplier 78 multiplies the value present at its first input by the value of the constant $\alpha^{2r}$ present at its second input in the Galois field GF$2^m$. This multiplication is implemented by corresponding XORings of the bits present at the first input. The constant $\alpha^{2r}$ is uniquely assigned to the r-th byte.

The multiplier 75 provides the value $$\frac{s_3}{s_1 s_3 + s_2^2}$$

at its output. The output of the multiplier 75 is connected to the first input of the XOR circuit 77.

The output of the constant multiplier 78 is connected to the second input of the XOR circuit 77. The XOR circuit 77 provides the value $$\frac{\alpha^{2r} s_1}{s_1 s_3 + s_2^2} + \frac{s_3}{s_1 s_3 + s_2^2} = \frac{\alpha^{2r} s_1 + s_3}{s_1 s_3 + s_2^2}$$

at its output. The output of the XOR circuit 77 is connected to the input of the inverter 79.

The inverter 79 provides the value $$\frac{s_1 s_3 + s_2^2}{\alpha^{2r} s_1 + s_3}$$

at its output. The output of the inverter 79 is connected to the second input of the AND circuit 710.

The value of the byte error position signal $BP_{S_r}$ is present at the first input of the AND circuit 710. The AND circuit 710 realizes a bit-by-bit ANDing of the m bits present at its second input with the byte error position signal $BP_{S_r}$. The AND circuit 710 thus provides the value $$\frac{s_1 s_3 + s_2^2}{s_3 + \alpha^{2r} s_1} \cdot BP_{S_r} = a(r) \cdot BP_{S_r} = a(r)^{cor}$$

at its output.

The part shown in FIG. 7 comprising the multipliers 71, 75, 76, the XOR circuit 72 and the squarer 73 outputs the values $$\frac{s_3}{s_1 s_3 + s_2^2}$$

and $$\frac{s_1}{s_1 s_3 + s_2^2}$$

at the outputs of the multipliers 75 and 76, which values are determined solely by the values of components $s_1$, $s_2$, $s_3$ and are independent of the byte position r. This part of the circuit is identical for all the byte error correction value forming units 510, 511, . . . , 51N−1 shown in FIG. 5. It is thus possible to provide this circuit part only once and to utilize the output signals of the multipliers 71, 75 and 76 for all the byte error correction value forming units 510 to 51N−1. For the different byte positions 0 to N−1, it is then only necessary to realize in each case the remaining part 711 of the circuit as shown in FIG. 7, comprising the XOR circuit 77, the constant multiplier 78, the inverter 79 and the AND circuit 710.

One option is to realize a byte error correction value forming unit for correctable byte positions, for example for all correctable byte positions or for a portion of the correctable byte positions using at most three multiplications. In this case, the three multiplications can be implemented using three multipliers. Moreover, one option is to carry out in particular further multiplications by a constant by means of constant multipliers.

Figure 8:
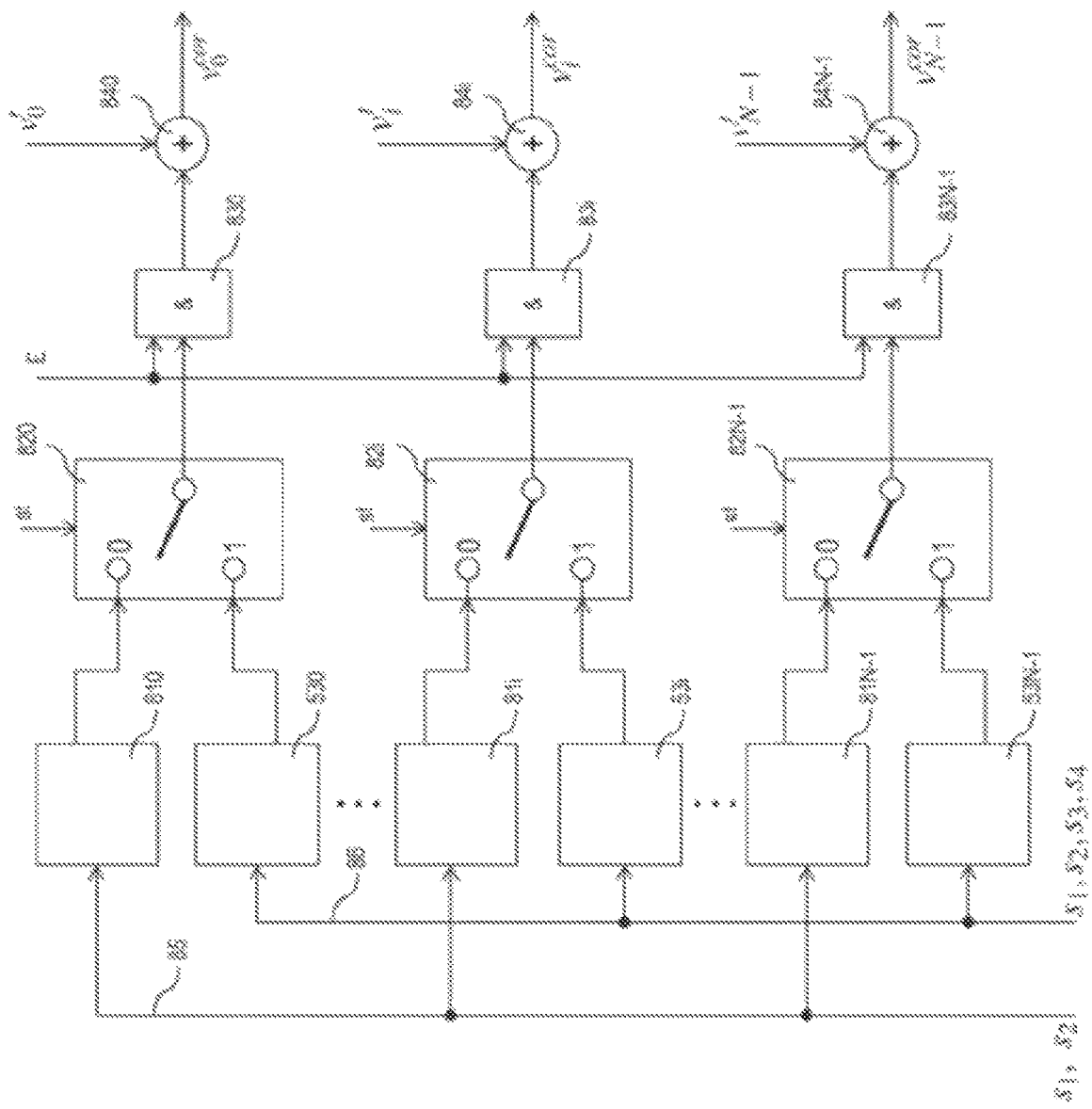
FIG. 8 shows an example of a correction circuit for 1-byte errors and 2-byte errors using a circuit arrangement for the formation of byte error position signals for 2-byte errors.

Correction of Both 1-Byte and 2-Byte Errors, FIG. 8

FIG. 8 shows one exemplary circuit for correcting 1-byte errors and 2-byte errors, wherein the circuits can be used for determining byte error position signals for 2-byte errors and for correcting 2-byte errors.

The circuit shown in FIG. 8 is configured for example in such a way that
a 2-byte error is corrected if a 2-byte error is present,
a 1-byte error is corrected if a 1-byte error is present, and
no correction is carried out if no error is present.

For this purpose, FIG. 8 comprises
N byte error correction value forming units 810, . . . , 81$i$, . . . , 81N−1 for correcting 1-byte errors, each having a 2·m-bit-wide input for inputting the components $s_1$, $s_2$ and an m-bit-wide output for outputting an m-bit-wide byte error correction value,
N byte correctors 530, . . . , 53$i$, . . . , 53N−1 for correcting 2-byte errors, each having a 4·m-bit-wide input for inputting the components $s_1$, $s_2$, $s_3$, $s_4$ and an m-bit-wide output for outputting an m-bit-wide byte error correction value, as described in FIG. 5,
N multiplexers 820, . . . , 82$i$, . . . , 82N−1, each having
a first m-bit-wide input (0-input),
a second m-bit-wide input (1-input),
a 1-bit-wide control input, to which a binary control signal st can be applied, and
an m-bit-wide output,
N AND circuits 830, . . . , 83$i$, . . . , 83N−1, each having a first 1-bit-wide input for inputting a binary error signal E, a second m-bit-wide input and an m-bit-wide output, and
N XOR circuits 840, . . . , 84$i$, . . . , 84N−1, each having a first m-bit-wide input, a second m-bit-wide input and an m-bit-wide output.

A line 85 carries the components $s_1$, $s_2$ and is connected to the respective input of the byte error correction value forming units 810, . . . , 81$i$, . . . , 81N−1.

A line 86 carries the components $s_1$, $s_2$, $s_3$, $s_4$ and is connected to the respective input of the byte correctors 530, . . . , 53$i$, . . . , 53N−1.

In the case of a 1-byte error in the byte position 0, the byte error correction value forming unit 810 provides the correct byte error correction value for the erroneous 0-th byte $v_0'$ at its output. This correspondingly applies to the further byte error correction value forming units. In this regard, in the case of a 1-byte error in the byte position i, the byte error correction value forming unit 81$i$ provides the correct byte error correction value for the erroneous i-th byte $v_1'$ at its output. In the case of a 1-byte error in the byte position (N−1), the byte error correction value forming unit 81N−1 provides the correct byte error correction value for the erroneous (N−1)-th byte $v_{N-1}'$ at its output.

Figure 10:
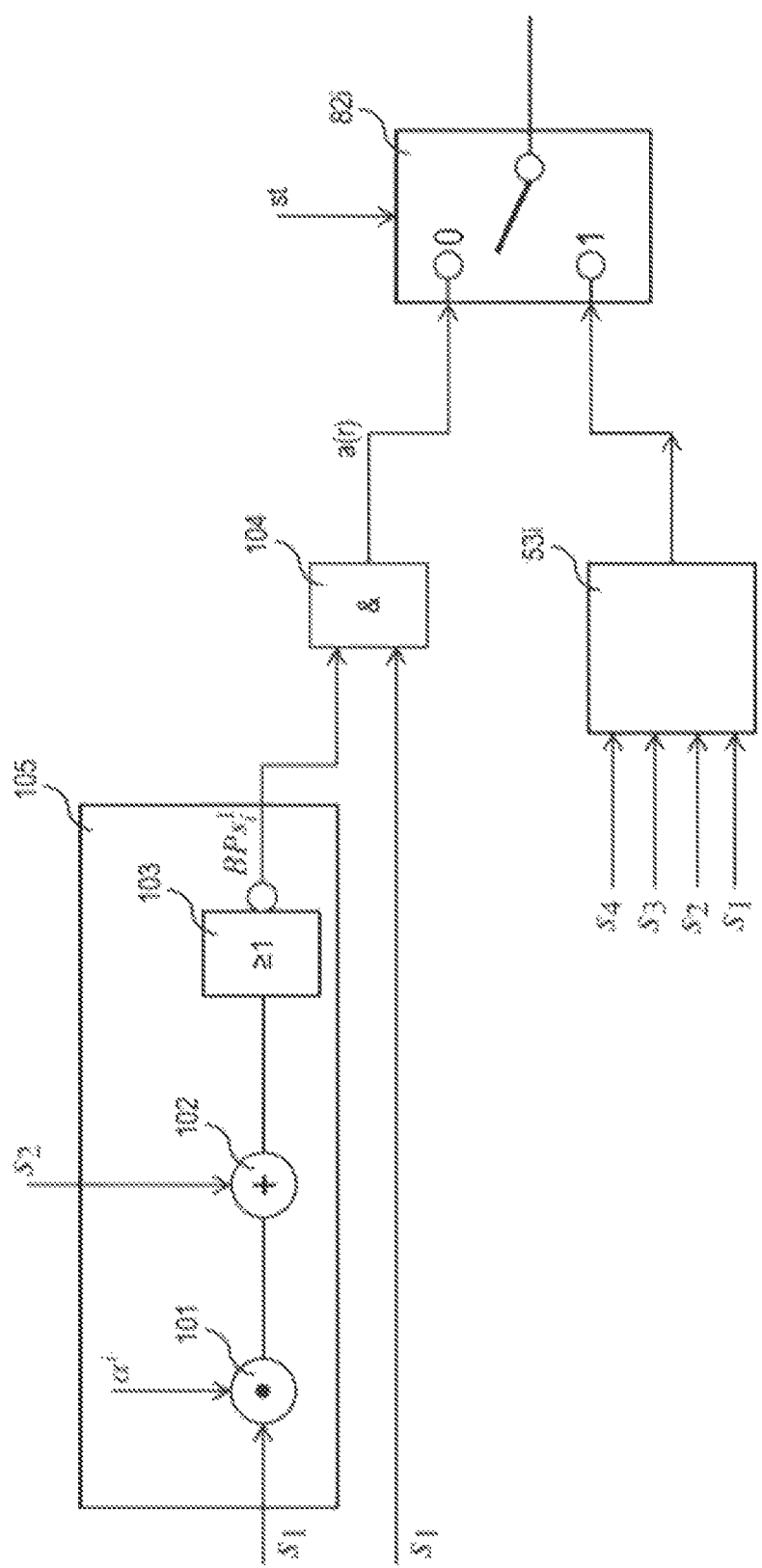
FIG. 10 shows an exemplary embodiment of the partial circuit shown in FIG. 8.

One possible realization of a byte error correction value forming unit for correcting a 1-byte error is explained in association with FIG. 10.

With regard to one possible realization of the byte correctors 530 to 53N−1, reference should be made for example to the byte error position signal forming units described in association with FIG. 2 and the byte error correction value forming units described in association with FIG. 6 and FIG. 7.

The output of the byte error correction value forming unit 810 is connected to the first input of the multiplexer 820. The output of the byte corrector 530 is connected to the second input of the multiplexer 820. If the value of the control signal st is equal to 0, then the multiplexer 820 connects its 0-input (the first input) to its output. If the value of the control signal st is equal to 1, then the multiplexer 820 connects its 1-input (the second input) to its output.

The binary error signal E is present at the first input of the AND circuit 830. The output of the multiplexer 820 is connected to the second input of the AND circuit 830. The output of the AND circuit 830 is connected to the first input of the XOR circuit 840. The possibly erroneous byte $v_0'$ is present at the second input of the XOR circuit 840. The XOR circuit 840 provides the corrected byte value $v_0^{cor}$ at its output.

The AND circuit 830 enables a component-by-component ANDing of the m-digit value present at its second input with the error signal E. If the error signal E=0, the AND circuit 830 outputs the m-component value 0. If the error signal E=1, the AND circuit 830 outputs the value present at its second input.

These explanations correspondingly apply to the remaining byte positions.

The output of the byte error correction value forming unit 81$i$ is connected to the first input of the multiplexer 82$i$. The output of the byte error correction value forming unit 53$i$ is connected to the second input of the multiplexer 82$i$. If the value of the control signal st is equal to 0, then the multiplexer 82$i$ connects its 0-input (the first input) to its output. If the value of the control signal st is equal to 1, then the multiplexer 82$i$ connects its 1-input (the second input) to its output.

The binary error signal E is present at the first input of the AND circuit 83$i$. The output of the multiplexer 82$i$ is connected to the second input of the AND circuit 83$i$. The output of the AND circuit 83$i$ is connected to the first input of the XOR circuit 84$i$. The possibly erroneous byte $v_i'$ is present at the second input of the XOR circuit 84$i$. The XOR circuit 84$i$ provides the corrected byte value $v_i^{cor}$ at its output.

The AND circuit 83$i$ enables a component-by-component ANDing of the m-digit value present at its second input with the error signal E. If the error signal E=0, the AND circuit 83$i$ outputs the m-component value 0. If the error signal E=1, the AND circuit 83$i$ outputs the value present at its second input.

The output of the byte error correction value forming unit 81N−1 is connected to the first input of the multiplexer 82N−1. The output of the byte error correction value forming unit 53N−1 is connected to the second input of the multiplexer 82N−1. If the value of the control signal st is equal to 0, then the multiplexer 82N−1 connects its 0-input (the first input) to its output. If the value of the control signal st is equal to 1, then the multiplexer 82N−1 connects its 1-input (the second input) to its output.

The binary error signal E is present at the first input of the AND circuit 83N−1. The output of the multiplexer 82N−1 is connected to the second input of the AND circuit 83N−1. The output of the AND circuit 83N−1 is connected to the first input of the XOR circuit 84N−1. The possibly erroneous byte $v_{N-1}'$ is present at the second input of the XOR circuit 84N−1. The XOR circuit 84N−1 provides the corrected byte value $v_{N-1}^{cor}$ at its output.

The AND circuit 83N−1 enables a component-by-component ANDing of the m-digit value present at its second input with the error signal E. If the error signal E=0, the AND circuit 83N−1 outputs the m-component value 0. If the error signal E=1, the AND circuit 83N−1 outputs the value present at its second input.

The error signal E assumes
the value 1 if a 1-byte error or a 2-byte error has occurred or
the value 0 if no error has occurred.
The control signal st assumes
the value 0 if a 1-byte error has occurred and
the value 1 if a 2-byte error has occurred.

Circuit for Correcting More than Two Byte Errors

Figure 9:
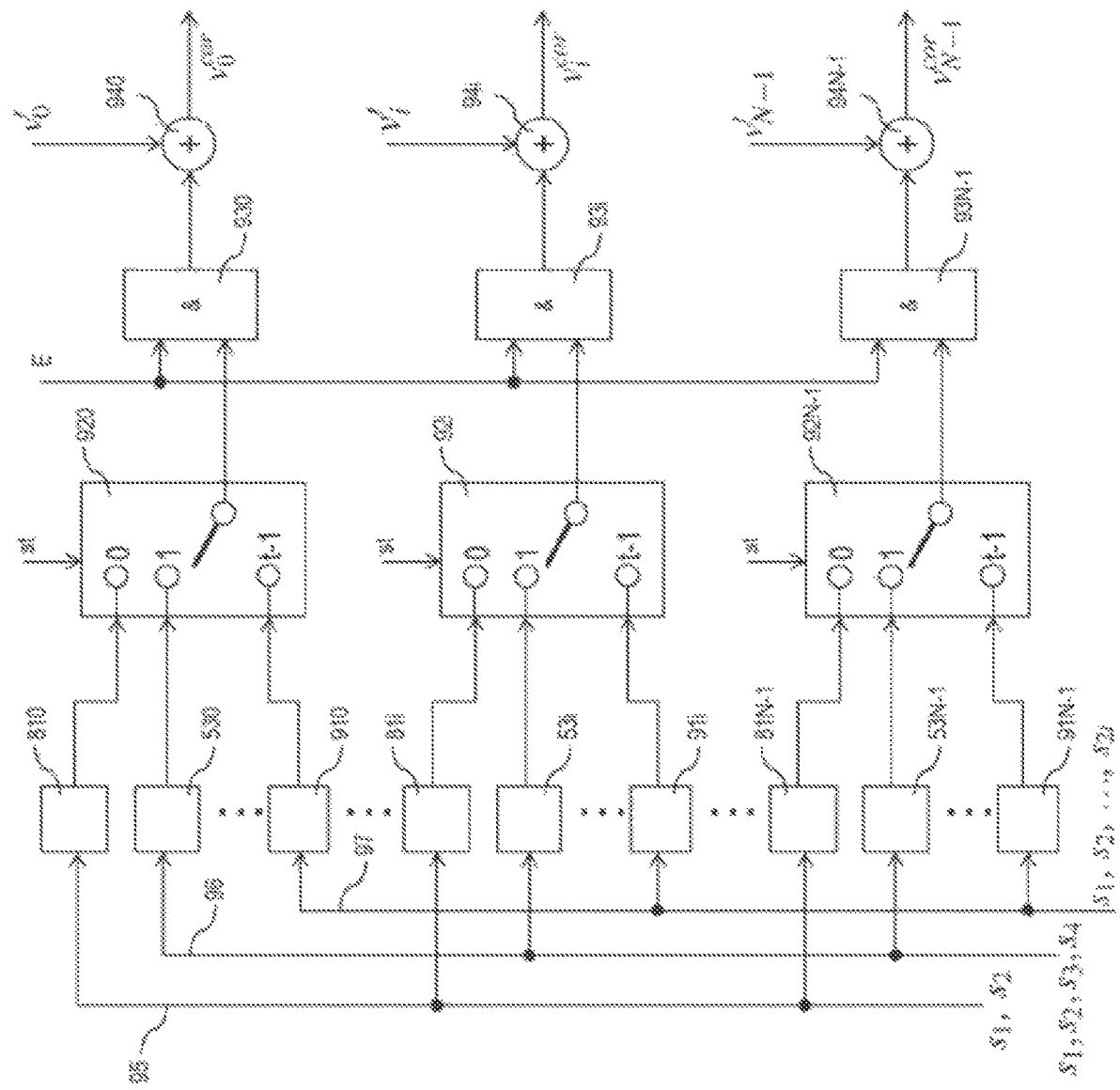
FIG. 9 shows an exemplary correction circuit for 1-byte errors, 2-byte errors, up to t-byte errors using a circuit arrangement for forming byte error position signals for 2-byte errors.

FIG. 9 shows a circuit for correcting 1-byte errors, 2-byte errors up to t-byte errors. The elements described in FIG. 8 can correspondingly be used in this circuit.

The circuit shown in FIG. 9 makes it possible that
a 1-byte error is corrected if a 1-byte error is present,
a 2-byte error is corrected if a 2-byte error is present,
a t-byte error is corrected if a t-byte error is present, and
no correction is carried out if no error is present.

By way of example, the case is described in which a t-byte-error-correcting and (t+1)-byte-error-detecting code is utilized, wherein in particular t>2 holds true.

The circuit in accordance with FIG. 9 comprises
the N byte error correction value forming units 810 to 81N−1 in accordance with FIG. 8,
the N byte correctors 530 to 53N−1 in accordance with FIG. 8 (as also described in FIG. 5), up to
N byte error correction value forming units 910, ..., 91i, ..., 91N−1 for correcting t-byte errors, each having a 2·t·m-bit-wide input for inputting the components $s_1, s_2, \ldots, s_{2t}$ and an m-bit-wide output for outputting an m-bit-wide byte error correction value,
N multiplexers 920, ..., 92i, ..., 92N−1, each having
a first m-bit-wide input (0-input),
a second m-bit-wide input (1-input),
up to a t-th m-bit-wide input ((t−1)-input),
a control input, at which a control signal st is present, which can assume t different values, and
an m-bit-wide output.
N AND circuits 930, ..., 93i, ..., 93N−1, each having a first 1-bit-wide input for inputting a binary error signal E, a second m-bit-wide input and an m-bit-wide output, and
N XOR circuits 940, ..., 94i, ..., 94N−1, each having a first m-bit-wide input, a second m-bit-wide input and an m-bit-wide output.

The 0-input of one of the multiplexers 920 to 92N−1 is connected to the output thereof if the control signal st has the value 0. Accordingly, a connection of one of the inputs 0 to (t−1) to the output can be produced by virtue of the corresponding control signal st assuming a value of between 0 and (t−1). If st=(t−1)=3 holds true, for example, then the third input (2-input) of the multiplexer is connected to the output thereof.

A line 95 carries the components $s_1, s_2$ and is connected to the respective input of the byte error correction value forming units 810, ..., 81i, ..., 81N−1.

A line 96 carries the components $s_1, s_2, s_3, s_4$ and is connected to the respective input of the byte correctors 530, ..., 53i, ..., 53N−1.

Finally, a line 97 is shown, with the aid of which the components $s_1, s_2, \ldots, s_{2t}$ are passed to the respective input of the byte error correction value forming units 910, ..., 91i, ..., 91N−1.

In the case of a 1-byte error in the byte position 0, the byte error correction value forming unit 810 provides the correct byte error correction value for the erroneous 0-th byte $v_0'$ at its output. This correspondingly applies to the further byte error correction value forming units. In this regard, in the case of a 1-byte error in the byte position i, the byte error correction value forming unit 81i provides the correct byte error correction value for the erroneous i-th byte $v_1'$ at its output. In the case of a 1-byte error in the byte position (N−1), the byte error correction value forming unit 81N−1 provides the correct byte error correction value for the erroneous (N−1)-th byte $v_{N-1}'$ at its output.

In the case of a 2-byte error, the byte corrector 530 provides the correct byte error correction value for the erroneous 0-th byte $v_0'$ at its output. This correspondingly applies to the further byte error correction value forming units. In this regard, in the case of a 2-byte error, the byte error correction value forming unit 53i provides the correct byte error correction value for the erroneous i-th byte $v_1'$ at its output. In the case of a 2-byte error, the byte error correction value forming unit 53N−1 provides the correct byte error correction value for the erroneous (N−1)-th byte $v_{N-1}'$ at its output.

In the case of a t-byte error, the byte error correction value forming unit 910 provides the correct byte error correction value for the erroneous 0-th byte $v_0'$ at its output. This correspondingly applies to the further byte error correction value forming units. In this regard, in the case of a t-byte error, the byte error correction value forming unit 91i provides the correct byte error correction value for the erroneous i-th byte $v_1'$ at its output. In the case of a t-byte error, the byte error correction value forming unit 91N−1 provides the correct byte error correction value for the erroneous (N−1)-th byte $v_{N-1}'$ at its output.

For non-erroneous bytes, the byte error correction values assigned to these byte positions are in each case masked with the value 0.

The output of the byte error correction value forming unit 810 is connected to the first input (0-input) of the multiplexer 920. The output of the byte corrector 530 is connected to the second input (1-input) of the multiplexer 920. Correspondingly, the output of the byte error correction value forming unit 910 is connected to the t-th input ((t−1)-input) of the multiplexer 920.

The binary error signal E is present at the first input of the AND circuit 930. The output of the multiplexer 920 is connected to the second input of the AND circuit 930. The output of the AND circuit 930 is connected to the first input of the XOR circuit 940. The possibly erroneous byte $v_0'$ is present at the second input of the XOR circuit 940. The XOR circuit 940 provides the corrected byte value $v_0^{cor}$ at its output.

The AND circuit 930 enables a component-by-component ANDing of the m-digit value present at its second input with the error signal E. If the error signal E=0, the AND circuit

930 outputs the m-component value 0. If the error signal E=1, the AND circuit 930 outputs the value present at its second input.

These explanations correspondingly apply to the remaining byte positions.

The output of the byte error correction value forming unit 81*i* is connected to the first input (0-input) of the multiplexer 92*i*. The output of the byte error correction value 53*i* is connected to the second input (1-input) of the multiplexer 92*i*. Correspondingly, the output of the byte error correction value forming unit 91*i* is connected to the t-th input ((t−1)-input) of the multiplexer 92*i*.

The binary error signal E is present at the first input of the AND circuit 93*i*. The output of the multiplexer 92*i* is connected to the second input of the AND circuit 93*i*. The output of the AND circuit 93*i* is connected to the first input of the XOR circuit 94*i*. The possibly erroneous byte $v_i'$ is present at the second input of the XOR circuit 94*i*. The XOR circuit 94*i* provides the corrected byte value $v_i^{cor}$ at its output.

The AND circuit 93*i* enables a component-by-component ANDing of the m-digit value present at its second input with the error signal E. If the error signal E=0, the AND circuit 93*i* outputs the m-component value 0. If the error signal E=1, the AND circuit 93*i* outputs the value present at its second input.

The output of the byte error correction value forming unit 81N−1 is connected to the first input (0-input) of the multiplexer 92N−1. The output of the byte error correction value forming unit 53N−1 is connected to the second input (1-input) of the multiplexer 92N−1. Correspondingly, the output of the byte error correction value forming unit 91N−1 is connected to the t-th input ((t−1)-input) of the multiplexer 92N−1.

The binary error signal E is present at the first input of the AND circuit 93N−1. The output of the multiplexer 92N−1 is connected to the second input of the AND circuit 93N−1. The output of the AND circuit 93N−1 is connected to the first input of the XOR circuit 94N−1. The possibly erroneous byte $v_{N-1}'$ is present at the second input of the XOR circuit 94N−1. The XOR circuit 94N−1 provides the corrected byte value $v_{N-1}^{cor}$ at its output.

The AND circuit 93N−1 enables a component-by-component ANDing of the m-digit value present at its second input with the error signal E. If the error signal E=0, the AND circuit 93N−1 outputs the m-component value 0. If the error signal E=1, the AND circuit 93N−1 outputs the value present at its second input.

The error signal E assumes
the value 1 if a 1-byte error or a 2-byte error, . . . or a t-byte error has occurred or
the value 0 if no error has occurred.

The control signal st assumes
the value 0 if a 1-byte error has occurred,
the value 1 if a 2-byte error has occurred,
etc.
the value (t−1) if a t-byte error has occurred.

Byte Error Corrector for 1-Byte Errors

FIG. 10 shows one exemplary circuit for a byte error correction value forming unit 81*i* for the i-th byte, such as was explained, e.g., with reference to FIG. 8.

The byte error correction value forming unit 81*i* comprises
a constant multiplier 101 having
a first m-bit-wide input,
a second m-bit-wide input, at which the constant value $\alpha^i$ is present, and
an m-bit-wide output,
an XOR circuit 102 having a first m-bit-wide input, a second m-bit-wide input and an m-bit-wide output,
a NOR circuit 103 having an m-bit-wide input and a 1-bit-wide output,
an AND circuit 104 having a first 1-bit-wide input, a second m-bit-wide input and an m-bit-wide output.

Furthermore, FIG. 10 shows the multiplexer 82*i* and the byte error correction value forming unit 53*i* from FIG. 8 (and FIG. 5).

The constant multiplier 101, the XOR circuit 102 and the NOR circuit 103 form a byte error position signal forming unit 105 and serve for example for forming the byte error position signal BPs$_i$, which indicates whether a 1-byte error is present in the i-th byte position.

At the output of the AND circuit 104, the m-dimensional byte error correction value $a(i)^{cor}$ is provided if a 1-byte error has occurred in the byte position i. If the 1-byte error has occurred in another byte position j different than i, the byte error position signal BPs$_j$=0 and the value 0 is thus also present at the output of the AND circuit 104.

The component $s_1$ is present at the first input of the constant multiplier 101 and a constant $\alpha^i$ is present at the second input of the constant multiplier 101. The output of the constant multiplier 101 is connected to the first input of the XOR circuit 102. The component $s_2$ is present at the second input of the XOR circuit 102. The output of the XOR circuit 102 is connected to the input of the NOR circuit 103. The output of the NOR circuit 103 is connected to the first input of the AND circuit 104. The component $s_1$ is present at the second input of the AND circuit 104. The output of the AND circuit 104 is connected to the first input of the multiplexer 82*i*.

The second input of the multiplexer 82*i* is connected to the output of the byte error correction value forming unit 53*i*.

Consequently, the byte error correction value for a 1-byte error is provided at the first input of the multiplexer 82*i* and the byte error correction value for a 2-byte error is provided at the second input of the multiplexer 82*i*.

Correspondingly, the control signal st for the multiplexer 82*i* is
equal to 0 if a 1-byte error is present, in order to connect the first input (0-input) of the multiplexer 82*i* to the output thereof, or
equal to 1 if a 2-byte error is present, in order to connect the second input (1-input) of the multiplexer 82*i* to the output thereof.

If no error is present, the value of the control signal st is arbitrary. It can be fixed at 0, for example, as is described by way of example below.

If no error is present, the value of the error signal E is equal to 0. This was explained above in association with FIG. 8. On the basis of the AND circuit 83*i* connected downstream, which logically ANDs the signal at the output of the multiplexer 82*i* component by component with the error signal E, it is ensured that in the case of an error signal E=0 (that is to say if no error is present) the value 0 is provided at the output of the AND circuit 83*i*, to be precise independently of the signal at the output of the multiplexer 82*i*. Consequently, no correction of the i-th byte is carried out.

Circuit for Determining an Error Signal

Figure 11:
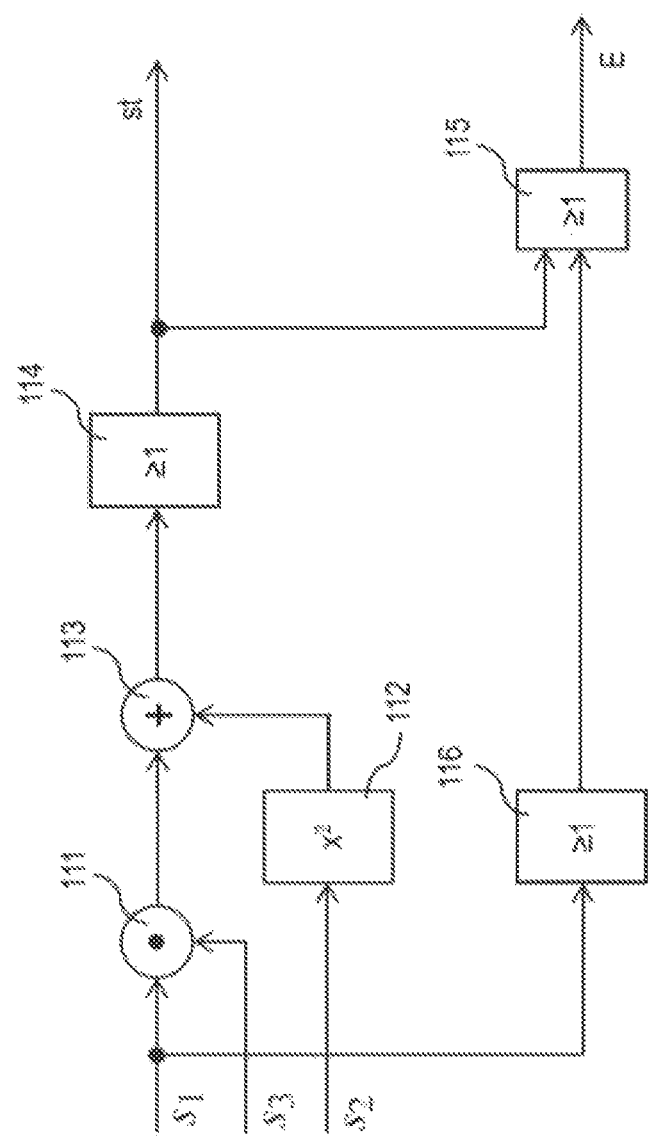
FIG. 11 shows an error detection circuit.

FIG. 11 shows one exemplary circuit for determining the error signal E such as is utilized for example in the circuit shown in FIG. 8.

The arrangement shown in FIG. 11 comprises
a multiplier 111 having a first m-bit-wide input, a second m-bit-wide input and an m-bit-wide output,
an XOR circuit 113 having a first m-bit-wide input, a second m-bit-wide input and an m-bit-wide output,
a squarer 112 having an m-bit-wide input and an m-bit-wide output,
an OR circuit 114 having an m-bit-wide input and a 1-bit-wide output,
an OR circuit 116 having an m-bit-wide input and a 1-bit-wide output, and
an OR circuit 115 having a first binary input, a second binary input and having a binary output.

The value of the component $s_1$ is present at the first input of the multiplier 111. The value of the component $s_3$ is present at the second input of the multiplier 111. The output of the multiplier 111 is connected to the first input of the XOR circuit 113.

The component $s_1$ is also present at the input of the OR circuit 116. The output of the OR circuit 116 is connected to the second input of the OR circuit 115.

The component $s_2$ is present at the input of the squarer 112. The output of the squarer 112 is connected to the second input of the XOR circuit 113.

The output of the XOR circuit 113 is connected to the input of the OR circuit 114 and the output of the OR circuit 114 is connected to the first input of the OR circuit 115.

The control signal st is provided at the output of the OR circuit 114 and the error signal E is provided at the output of the OR circuit 115.

The control signal st assumes the value 0 if the following holds true:

Correspondingly, the control signal st assumes the value 1 if the following holds true:

The error signal E assumes the value 0 if the control signal st is equal to 0 and if the value of the component $s_1$ is equal to 0. In this case, neither a 1-byte error nor a 2-byte error is present.

If the value of the control signal st is equal to 1, a 2-byte correction using the byte correctors 530 to 53N−1 is carried out in the circuit in accordance with FIG. 8.

If the value of the control signal st is equal to 0, firstly a 1-byte correction using the byte error correction value forming units 810 to 81N−1 is carried out in the circuit in accordance with FIG. 8. If the error signal E is also equal to 0, such that neither a 1-byte error nor a 2-byte error is present, the AND circuits 830 to 83N−1 all output the value 0, such that no correction of the bytes $v_0'$ to $v_{N-1}'$ is carried out.

If a 3-byte error is detected, the error correction can be terminated, for example. Such a termination of the error correction can be carried out at the system level.

Figure 12:
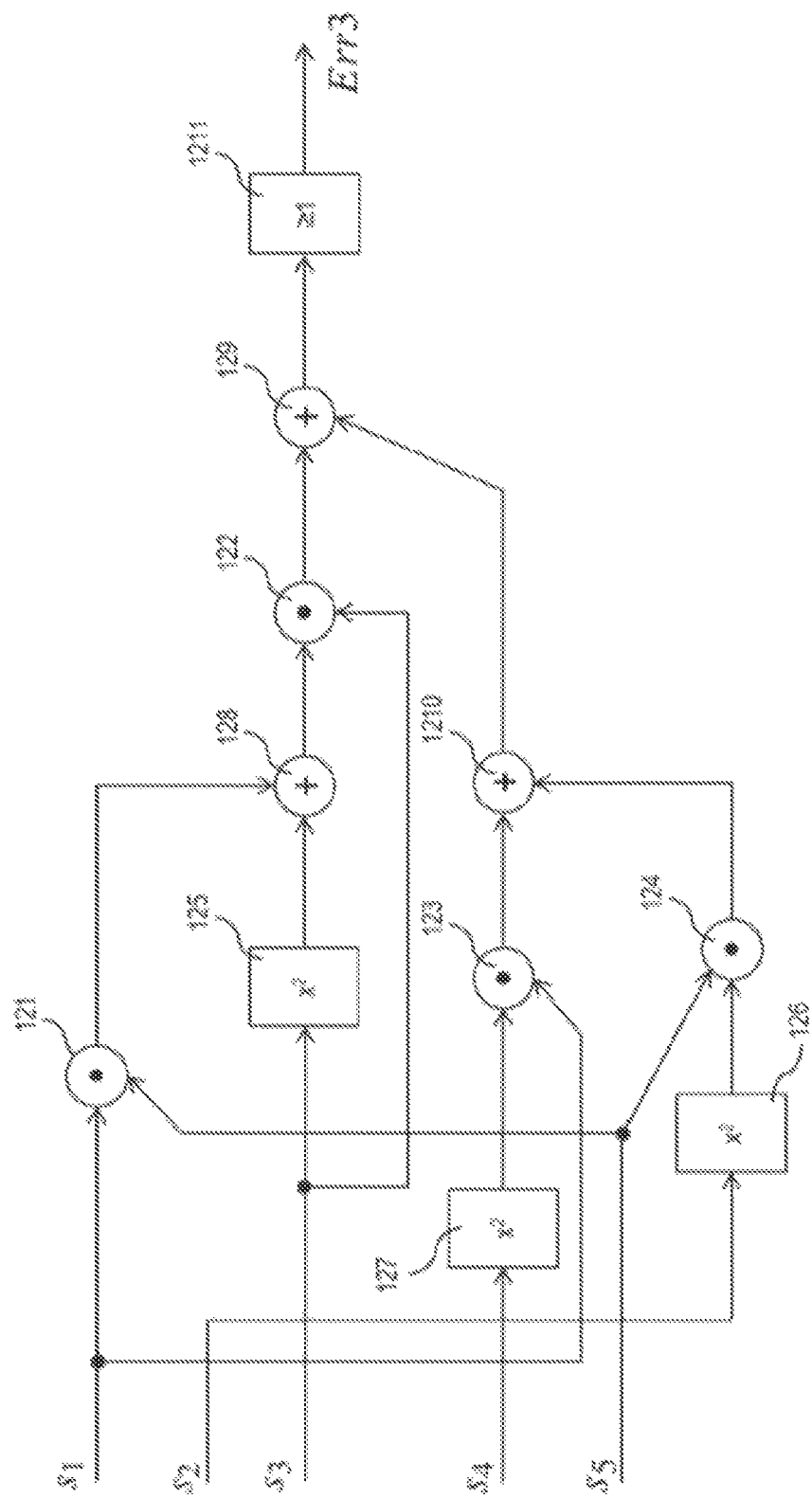
FIG. 12 shows an error detection circuit for detecting 3-byte errors.

FIG. 12 shows one exemplary circuit for detecting a 3-byte error. For this purpose, the circuit comprises
four multipliers 121, 122, 123, 124, each having a first m-bit-wide input, a second m-bit-wide input and an m-bit-wide output,
three squarers 125, 126, 127, each having an m-bit-wide input and an m-bit-wide output,
three XOR circuits 128, 129, 1210, each having a first m-bit-wide input, a second m-bit-wide input and an m-bit-wide output, and
an OR circuit 1211 having an m-bit-wide input and a binary output, wherein the OR circuit 1211 carries out a component-by-component ORing of the m bits present at its input.

The value of the component $s_1$ is present at the first input of the multiplier 121 and at the second input of the multiplier 123.

The value of the component $s_2$ is present at the input of the squarer 126.

The value of the component $s_3$ is present at the input of the squarer 125 and at the second input of the multiplier 122.

The value of the component $s_4$ is present at the input of the squarer 127.

The value of the component $s_5$ is present at the second input of the multiplier 121 and at the first input of the multiplier 124.

The output of the multiplier 121 is connected to the first input of the XOR circuit 128. The output of the squarer 125 is connected to the second input of the XOR circuit 128. The output of the XOR circuit 128 is connected to the first input of the multiplier 122. The output of the multiplier 122 is connected to the first input of the XOR circuit 129.

The output of the squarer 127 is connected to the first input of the multiplier 123. The output of the multiplier 123 is connected to the first input of the XOR circuit 1210.

The output of the squarer 126 is connected to the second input of the multiplier 124 and the output of the multiplier 124 is connected to the second input of the XOR circuit 1210. The output of the XOR circuit 1210 is connected to the second input of the XOR circuit 129. The output of the XOR circuit 129 is connected to the input of the OR circuit 1211 and a signal Err3 is available at the output of the OR circuit 1211, on the basis of which signal a 3-byte error can be determined.

The signal Err3 assumes the value 1 if the following holds true:

$(s_1 s_5 + s_3^2) \cdot s_3 + s_2^2 s_5 + s_4^2 s_1 = s_1 s_3 s_5 + s_3^3 + s_2^2 s_5 + s_4^2 s_1 \neq 0.$ Correspondingly, the signal Err3 assumes the value 0 if the following holds true:

$(s_1 s_5 + s_3^2) \cdot s_3 + s_2^2 s_5 + s_4^2 s_1 = 0.$

Alternative Determination of Byte Error Correction Values

An alternative, efficient variant for determining byte error correction values is described below.

The correction of 2-byte errors is considered in exemplary fashion.

According to equation (14), the byte error correction value a(k) for the k-th byte position is determined as $$a(k) = \frac{s_1 s_3 + s_2^2}{s_3 + \alpha^{2k} s_1}$$

Hence, for each byte position k to be corrected, the value $s_1 s_3 + s_2^2$ determined from the syndrome components $s_1$, $s_2$, $s_3$ should be divided by $s_3 + \alpha^{2k} s_1$ in the Galois field $GF(2^m)$. This divisor depends on the byte position k and is different for each byte position. Hence, a separate division is required for each byte position.

By way of example, this division can be implemented by virtue of, initially, the inverse value $$\frac{1}{s_3 + \alpha^{2k} s_1}$$

of the divisor being formed in the Galois field GF($2^m$) using an inverter, said inverse value then being multiplied by the term $s_1 s_3 + s_2$ using a multiplier.

By way of example, an inverter and a multiplier is required in this case for each byte position to be corrected.

A reduction in the realization outlay can be achieved by virtue of initially determining $$\frac{1}{a(k)} = \frac{s_3 + \alpha^{2k} s_1}{s_1 s_3 + s_2^2} = \frac{s_3}{s_1 s_3 + s_2^2} + \frac{s_1}{s_1 s_3 + s_2^2} \cdot \alpha^{2k}$$

instead of a(k). The following arises with an inversion:

$$a(k) = \frac{1}{\frac{1}{a(k)}} = \frac{1}{\frac{s_1}{s_1 s_3 + s_2^2} + \frac{s_1}{s_1 s_3 + s_2^2} \cdot \alpha^{2k}}.$$

In this case, the term $$\frac{s_3}{s_1 s_3 + s_2^2}$$

and the term $$\frac{s_1}{s_1 s_3 + s_2^2}$$

can be formed centrally and can be provided for all byte positions to be corrected.

For the k-th byte position, the term $$\frac{s_1}{s_1 s_3 + s_2^2}$$

can be multiplied by $\alpha^{2k}$. For each byte position this multiplication is a multiplication by a constant corresponding to the byte position.

The inverse value of $$\frac{s_3}{s_1 s_3 + s_2^2} + \frac{s_1}{s_1 s_3 + s_2^2} \cdot \alpha^{2k}$$

is determined in parallel or at least partly in parallel or at least partly simultaneously (i.e., temporally overlapping in parts) using an inverter in the Galois field GF($2^m$). In this case, k assumes all values for which byte positions are corrected in the case of a byte error. What is disadvantageous here is that an inverter in the Galois field GF($2^m$) is required for each byte position to be corrected in the case of (at least partly) parallel processing.

How byte error correction values can be determined efficiently is explained in exemplary fashion below on the basis of the correction of 2-byte errors.

What is advantageous here is that the coefficients of a locator polynomial are symmetric functions of the erroneous byte positions and can be determined as functions of components of the error syndrome by solving a linear system of equations.

In the case of the 2-byte error in the byte positions $\alpha^i$ and $\alpha^j$, the coefficients of the locator polynomial $$L_2(x) = x^2 + x \cdot \sigma_1 + \sigma_2 = (x + \alpha^i)(x + \alpha^j)$$

are determined as $$\sigma_1 = \alpha^i + \alpha^j \text{ and } \sigma_2 = \alpha^i \cdot \alpha^j.$$

In this case, $\sigma_1$ and $\sigma_2$ are symmetric functions of the byte positions $\alpha^i$ and $\alpha^j$, where $\sigma_1$ is the coefficient of the linear term x of the locator polynomial $L_2(x)$ and the sum of $\alpha^i$ and $\alpha^j$.

The following relationship exists between the syndrome components $s_1$, $s_2$, $s_3$, $s_4$ and the coefficients $\sigma_1$ and $\sigma_2$ of the locator polynomial:

$$\begin{pmatrix} s_1 & s_2 \\ s_2 & s_3 \end{pmatrix} \cdot \begin{pmatrix} \sigma_2 \\ \sigma_1 \end{pmatrix} = \begin{pmatrix} s_3 \\ s_4 \end{pmatrix}. \tag{45}$$

This can be verified by inserting the following values:

Equation (45) is a linear system of equations which allows the coefficients $\sigma_1$ and $\sigma_2$ to be determined as functions of the syndrome components $s_1$, $s_2$, $s_3$, $s_4$, as $$\sigma_1 = \frac{s_2 s_3 + s_1 s_4}{s_1 s_3 + s_2^2}$$

and $$\sigma_2 = \frac{s_2 s_4 + s_3^1}{s_1 s_3 + s_2^2}$$

By way of example, in the case of a 2-byte error, the byte error correction values can advantageously be determined on the basis of the coefficient $\sigma_1$ of the linear term of the locator polynomial $L_2(x)$ such that a simple realization of the determination of the byte error correction values emerges.

To correct byte positions possibly coming into question, a potential byte error correction value is determined for erroneous byte positions and non-erroneous byte positions. If a 2-byte error is present and a byte position is erroneous, there can be a correction for this byte position by means of the byte error correction value. Should a byte position not be erroneous, the byte error correction value may adopt any value for this byte position.

In this context, it should be observed that the designation "erroneous" assumes that an error was detected for the byte position. Moreover, there is the possibility of an error being present but not being detected, and consequently not being able to be corrected either. This case is not covered by the designation "erroneous" in the present context. A corresponding statement applies when "non-erroneous" is referred to in the present case.

A byte error position signal is determined for the erroneous and non-erroneous byte positions using the locator polynomial $L_2(x)$. In this case, the byte error position signal adopts a first value for the byte position $\alpha^i$ should $L_2(\alpha^i)=0$ and the byte be erroneous, and it adopts a second value that differs from the first value when $L_2(\alpha^i) \neq 0$ and the byte is non-erroneous.

If the byte at byte position $\alpha$ is erroneous and hence $L_2(\alpha^i)=0$ applies, then the potential byte error correction value determined for this byte position is used to correct this byte detected as erroneous. If the byte at byte position $\alpha^i$ is non-erroneous and hence $L_2(\alpha^i) \neq 0$ applies, then the potential byte error correction value determined for this byte position is not used for correction purposes.

Consequently, whether or not the potential byte correction value determined for this byte position is used for correction purposes can be determined using the byte error position signal determined for the respective byte position.

By way of example, use is made of a Reed-Solomon code in the Galois field $GF(2^m)$ with four syndrome components $s_1, s_2, s_3, s_4$.

Like in equations (2) and (3), use is initially made of an H matrix, the first line of which is $\alpha^0, \alpha^0, \ldots, \alpha^0$. The H matrices $H_{Byte}$ used in equations (2) and (3) have 3 rows and 5 rows.

The H matrix H of the Reed-Solomon code used in exemplary fashion in this section has 4 rows:

$$H = \begin{pmatrix} \alpha^0 & \alpha^0 & \ldots & \alpha^0 & \ldots & \alpha^0 \\ \alpha^0 & \alpha^1 & \ldots & \alpha^i & \ldots & \alpha^{n-1} \\ \alpha^0 & \alpha^2 & \ldots & \alpha^{2 \cdot i} & \ldots & \alpha^{2 \cdot [n-1]} \\ \alpha^0 & \alpha^3 & \ldots & \alpha^{3 \cdot i} & \ldots & \alpha^{3 \cdot [n-1]} \end{pmatrix} \quad (46)$$

The H matrix H according to equation (46) emerges from the H matrix $H_{Byte}$ according to equation (3) by deleting the last row.

If there is a 2-byte error with byte error values a and b at byte positions i and j, the syndrome components $s_1, s_2, s_3, s_4$, according to equation (5), emerge as $s_1 = a+b$ $s_2 = \alpha^i a + \alpha^j b$ $s_3 = \alpha^{2i} a + \alpha^{2j} b$ $s_4 = \alpha^{3i} a + \alpha^{3j} b$ \quad (47)

A locator polynomial $L_2(x)$ in the form $L_2(x) = x^2 + \sigma_1 x + \sigma_2$ \quad (48)

with $$\sigma_1 = \frac{s_1 s_4 + s_2 s_3}{s_1 s_3 + s_2^2} \text{ and } \sigma_2 = \frac{s_2 s_4 + s_3^2}{s_1 s_3 + s_2^2} \quad (49)$$

is for example determined by virtue of dividing the left-hand side of equation (12) by $s_1 s_3 + s_2^2$, such that the following applies:

$$L_2(x) = \frac{L(x)}{s_1 s_3 + s_2^2} \quad (50)$$

If there is a 2-byte error at byte positions i and j with the byte error values a and b, then the syndrome components $s_1$ to $s_4$ are determined in accordance with equation (47). With the syndrome components $s_1$ to $s_4$, the following applies:

$$s_1 \cdot s_4 + s_2 \cdot s_3 = (a+b)(\alpha^{3i} a + \alpha^{3j} b) + (\alpha^i a + \alpha^j b)(\alpha^{2i} a + \alpha^{2j} b) =$$
$$= \alpha^{3i} a^2 + \alpha^{3i} ab + \alpha^{3j} ab + \alpha^{3j} b^2 +$$
$$+ \alpha^{3i} a^2 + \alpha^{2i} \alpha^j ab + \alpha^i \alpha^{2j} ab + \alpha^{3j} b^2 =$$

-continued
$$= ab(\alpha^{3i} + \alpha^{3j} + \alpha^i \alpha^{2j} + \alpha^j \alpha^{2i})$$

and $$s_1 s_3 + s_2^2 = (a+b)(\alpha^{2i} a + \alpha^{2j} b) + (\alpha^i a + \alpha^j b)^2 =$$
$$= \alpha^{2i} a^2 + \alpha^{2i} ab + \alpha^{2j} ab + \alpha^{2j} b^2 + \alpha^{2i} a^2 + \alpha^{2j} b^2 =$$
$$= ab(\alpha^{2i} + \alpha^{2j}).$$

From this, the following emerges:

$$\sigma_1 = \frac{s_1 \cdot s_4 + s_2 \cdot s_3}{s_1 \cdot s_3 + s_2^2} = \quad (51)$$
$$= \frac{ab(\alpha^{3i} + \alpha^{3j} + \alpha^i \alpha^{2j} + \alpha^j \alpha^{2i})}{ab(\alpha^{2i} + \alpha^{2j})} =$$
$$= \frac{\alpha^i \cdot \alpha^i \cdot \alpha^i + \alpha^j \cdot \alpha^j \cdot \alpha^j + \alpha^i \cdot \alpha^j \cdot \alpha^j + \alpha^i \cdot \alpha^i \cdot \alpha^j}{\alpha^{2i} + \alpha^{2j}} =$$
$$= \frac{\alpha^{2i} \cdot (\alpha^i + \alpha^j) + \alpha^{2j} \cdot (\alpha^i + \alpha^j)}{\alpha^{2i} + \alpha^{2j}} =$$
$$= \alpha^i + \alpha^j.$$

The addition of two identical expressions yields the value of 0 in a Galois field $GF(2^m)$. Thus, for example the following applies:

$\alpha^{3i} a^2 + \alpha^{3i} a^2 = 0$.

The following still applies:

$L_2(\alpha^i) = L_2$ and $= 0$ und i for $\neq 0$ füx $\neq \alpha^i, \alpha^j$.

One option is to determine $\sigma_1$ as a component-by-component XOR sum $$\sigma_1 = \sum_{k=0}^{n-1} \delta_k \cdot \alpha^k \quad (52)$$

with $$\delta_k = \begin{cases} 1 & \text{for } L_2(\alpha^k) = 0 \\ 0 & \text{for } L_2(\alpha^k) \neq 0 \end{cases} \quad (53)$$

According to equations (52) and (53), $\sigma_1$ is determined as XOR sum of the two values of the Galois field $GF(2^m)$ which correspond to the two zeros of the locator polynomial $L_2(x)$.

One option is to replace a locator polynomial of equation (48)

$L_2(x) = x^2 + \sigma_1 x + \sigma_2$ with a locator polynomial $L_2'(x) = y^2 \sigma_2 + y \sigma_1 + 1$ \quad (54)

Equation (54) arises by inserting $$y = \frac{1}{x}$$

into equation (48). The zeros of $L_2'(y)$ are $\alpha^{-i}$ and $\alpha^{-j}$ if the zeros of $L_2(x)$ are $\alpha^i$ and $\alpha^j$.

A byte error correction value is determined for byte positions that are corrected in the case of the byte error. By way of example, if the byte positions 0 to n−1 are byte positions to be corrected, then a byte error value a(k) is determined for k with 0≤k≤n−1 such that the following applies:

$$a(k) = \frac{s_2}{\sigma_1} + s_1 + \frac{s_1}{\sigma_1}\alpha^k. \quad (55)$$

If there is a 2-byte error in the byte positions $\alpha^i$ and $\alpha^j$ with the byte error correction value a in byte position $\alpha^i$ and the byte error correction value b in byte position $\alpha^j$, the following, according to equation (55), applies to the i-th byte position with k=i:

$$a(i) = \frac{s_2}{\sigma_1} + s_1 + \frac{s_1}{\sigma_1}\alpha^i = a$$

and the following, according to equation (55), applies to the j-th byte position with k=j:

$$a(j) = \frac{s_2}{\sigma_1} + s_1 + \frac{s_1}{\sigma_1}\alpha^j = b.$$

The byte error correction value determined according to equation (55) is not used for correction purposes in byte positions where no byte error is present. If the values at byte positions i and j are erroneous in the case of a 2-byte error, then the values determined for k≠i and k≠j are not used for the error correction. The byte error correction values a or b required in each case for correction purposes are provided at the byte positions k=i and k=j: in the case of the 2-byte error at byte positions $\alpha^i$ and $\alpha^j$, $$s_1 = a+b$$

$$s_2 = \alpha^i a + \alpha^j b$$

$$\sigma_1 = \alpha^i + \alpha^j$$

are inserted into equation (55) and the following arises:

$$\begin{aligned}a(k) &= \frac{\alpha^i a + \alpha^j b}{\alpha^i + \alpha^j} + (a+b) + \frac{(a+b)\alpha^k}{\alpha^i + \alpha^j}\\ &= \frac{\alpha^i a + \alpha^j b + \alpha^i a + \alpha^j a + \alpha^j a + \alpha^j b + \alpha^k a + \alpha^k b}{\alpha^i + \alpha^j}\\ &= \frac{a(\alpha^k + \alpha^j) + b(\alpha^k + \alpha^i)}{\alpha^i + \alpha^j}\\ &= \begin{cases} \text{for für } k=i \\ \text{for für } k=j\end{cases}\end{aligned}$$

It is advantageous that a technical implementation of the relationship specified in equation (55) facilitates a significant simplification and hence a higher efficiency. Thus, the values $$\frac{s_2}{\sigma_1} + s_1 \quad (56)$$

and $$\frac{s_1}{\sigma_1} \quad (57)$$

may for example be formed centrally (in advance) and optionally only once in each case, and may be reused to determine all byte positions to be corrected.

By way of example, for each byte position k to be corrected, the value $$\frac{s_1}{\sigma_1}$$

can be multiplied by the constant value $\alpha^k$, which is known for the byte position k. The multiplication by the value $\alpha^k$ known for the byte position is a multiplication by a constant and can be realized with a simple constant multiplier.

Then, the values $$\frac{s_2}{\sigma_1} + s_1 \text{ and } s_1 \text{ and } \frac{s_1}{\sigma_1} \cdot \alpha^k$$

can be XORed component by component.

Hence, in contrast to previously known methods, it is possible to save one inversion per byte in the Galois field $GF(2^m)$.

One option lies in the use of an H matrix H*

$$H^* = \begin{pmatrix} \alpha^0 & \alpha^1 & \dots & \alpha^i & \dots & \alpha^{n-1} \\ \alpha^0 & \alpha^2 & \dots & \alpha^{2 \cdot i} & \dots & \alpha^{2 \cdot [n-1]} \\ \alpha^0 & \alpha^3 & \dots & \alpha^{3 \cdot i} & \dots & \alpha^{3 \cdot [n-1]} \\ \alpha^0 & \alpha^4 & \dots & \alpha^{4 \cdot i} & \dots & \alpha^{4 \cdot [n-1]} \end{pmatrix} \quad (58)$$

The H matrix H* according to equation (58) has four rows, whereas the H matrix $H_{Byte}$* according to equation (1) comprises only three rows.

If there is a 2-byte error with the byte error values a and b at byte positions i and j, the syndrome components $s_1$ to $s_4$ arise as:

$$s_1 = \alpha^i a + \alpha^j b$$

$$s_2 = \alpha^{2i} a + \alpha^{2j} b$$

$$s_3 = \alpha^{3i} a + \alpha^{3j} b$$

$$s_4 = \alpha^{4i} a + \alpha^{4j} b \quad (59)$$

Using the H matrix H* according to equation (58) and the syndrome components as per equation (59), a byte error correction value a(k) for the k-th byte is determined as follows:

$$a(k) = \left(\frac{s_2}{\sigma_1} + s_1\right) \cdot \alpha^{-k} + \frac{s_1}{\sigma_1} \quad (60)$$

If a 2-byte error is present at byte positions i and j with the byte error values a and b, then a(i)=a and a(j)=b applies. This is a consequence of inserting the syndrome components $s_1$ to $s_4$ according to equation (59) into equation (49) and equation (60).

The implementation of the relationship according to equation (60) facilitates a simplification over previously known approaches. Thus, the values $$\frac{s_2}{\sigma_1} + s_1 \quad (61)$$

and $$\frac{s_1}{\sigma_1} \quad (62)$$

may for example be formed centrally (in advance) and optionally only once in each case, and may be reused to determine all byte positions to be corrected.

By way of example, for each byte position k to be corrected, the value $$\frac{s_2}{\sigma_1} + s_1$$

can be multiplied by the constant value $\alpha^{-k}$, known for the byte position k, for example by means of the constant multiplier.

Then, the values $$\left(\frac{s_2}{\sigma_1} + \text{and } x^{-k} \text{ and } \frac{s_1}{\sigma_1}\right)$$

can be XORed component by component.

Hence, in contrast to previously known methods, it is possible to save one inversion per byte in the Galois field $GF(2^m)$.

In the case of a 2-byte error at the byte position $\alpha^i$ with the byte error value a and at the byte position $\alpha^j$ with the byte error value b, the following applies independently of a and b:

$$\alpha^i + \alpha^j = \frac{s_1 s_4 + s_2 s_3}{s_1 s_3 + s_2^2}. \quad (63)$$

This can be verified by inserting the syndrome components $s_1$ to $s_4$ according to equation (59):

$$\sigma_1 = \frac{s_1 \cdot s_4 + s_2 \cdot s_3}{s_1 \cdot s_3 + s_2^2} = \quad (64)$$

$$= \frac{ab \cdot (\alpha^i \alpha^{4j} + \alpha^{4i} \alpha^j + \alpha^{2i} \alpha^{3j} + \alpha^{3i} \alpha^{2j})}{ab \cdot (\alpha^i \alpha^{3j} + \alpha^{3i} \alpha^j)} =$$

$$= \frac{\alpha^i \cdot (\alpha^{3i} \alpha^j + \alpha^i \alpha^{3j}) + \alpha^j \cdot (\alpha^i \alpha^{3j} + \alpha^{3i} \alpha^j)}{\alpha^i \alpha^{3j} + \alpha^{3i} \alpha^j} =$$

$$= \alpha^i + \alpha^j.$$

Even when the H matrix H* according to equation (58) is used, there is the option of determining $\sigma_1$ as component-by-component XOR sum $$\sigma_1 = \sum_{k=0}^{n-1} \delta_k \cdot \alpha^k \quad (65)$$

where the following applies:

$$\delta_k = \begin{cases} 1 \text{ for } L_2(\alpha^k) = 0 \\ 0 \text{ for } L_2(\alpha^k) \neq 0 \end{cases}$$

In the case of a 2-byte error in byte positions i and j, the locator polynomial $L_2(x)$ assumes a value of 0 for $x=\alpha^i$ and $x=\alpha^j$ and assumes a value not equal to 0 for all other byte positions, and so, according to equation (65), the following applies in the case of a 2-byte error at byte positions i and j:

$$\sigma_1 = \alpha^i + \alpha^j.$$

Figure 14:
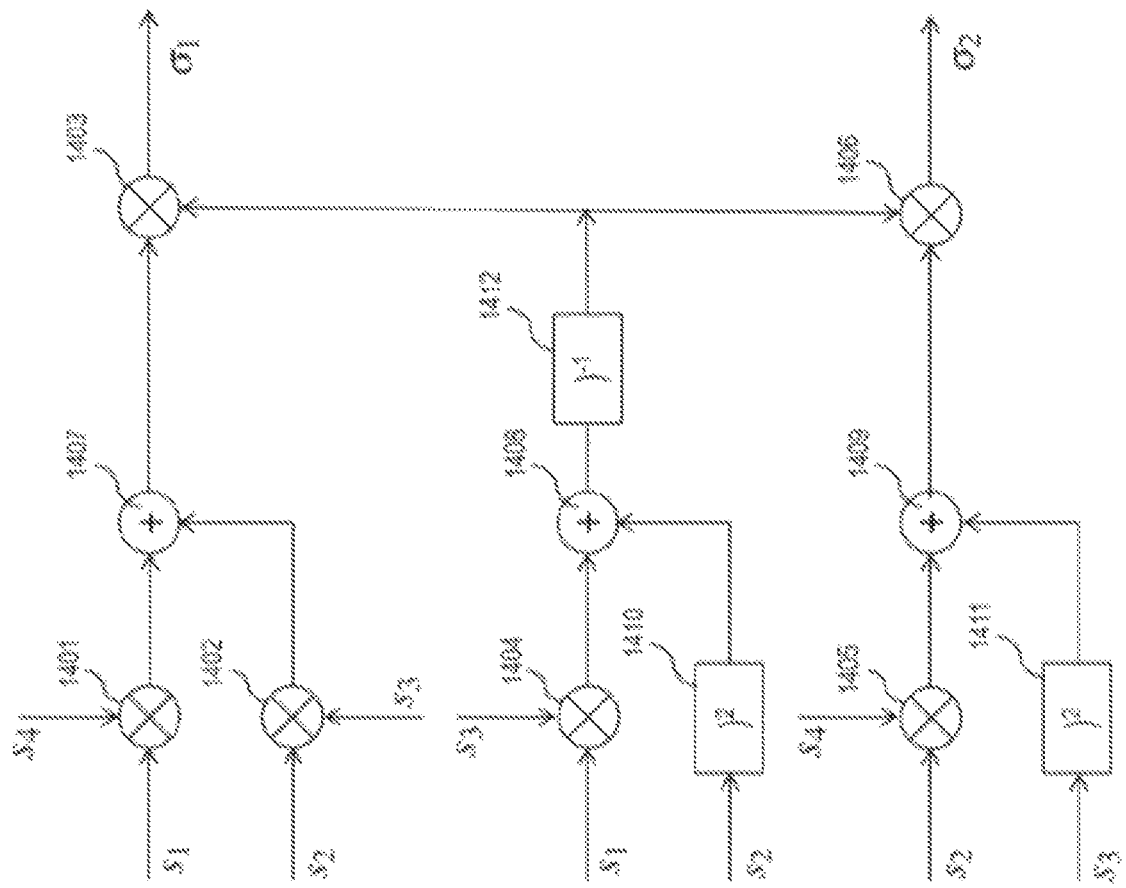
FIG. 14 shows an exemplary embodiment for the formation of the coefficients $\sigma_1$ and $\sigma_2$.

FIG. 14 shows an exemplary embodiment for forming the coefficients $\sigma_1$ and $\sigma_2$ according to equation (49) on the basis of syndrome components $s_1$ to $s_4$ by means of Galois multipliers 1401 to 1406, adders (component-by-component XORing) 1407 to 1409, squarers 1410, 1411 and an inverter 1412 (in the Galois field $GF(2^m)$).

Figure 15:
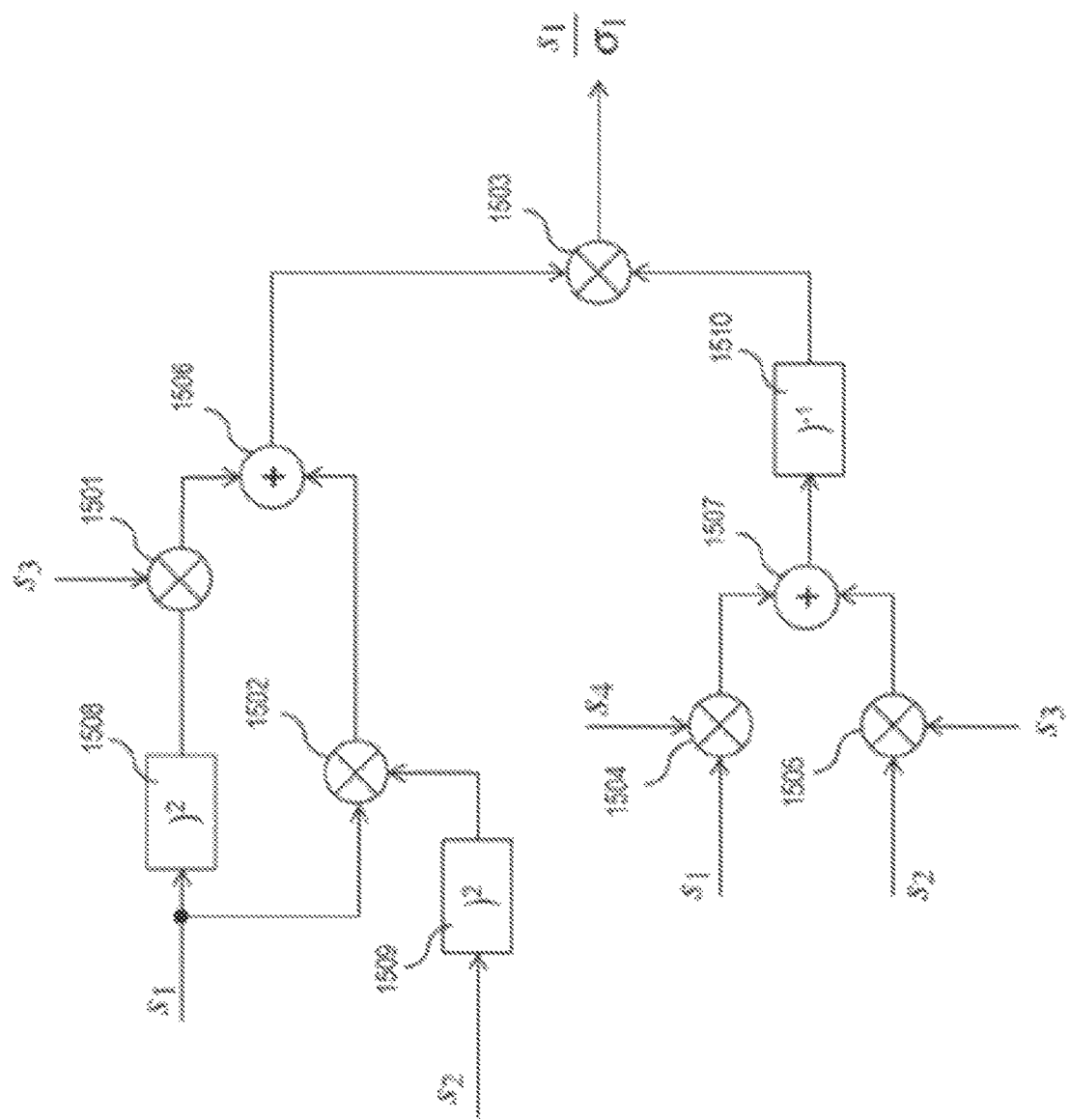
FIG. 15 shows an exemplary embodiment for the formation of the term $s_1/\sigma_1$.
Figure 18:
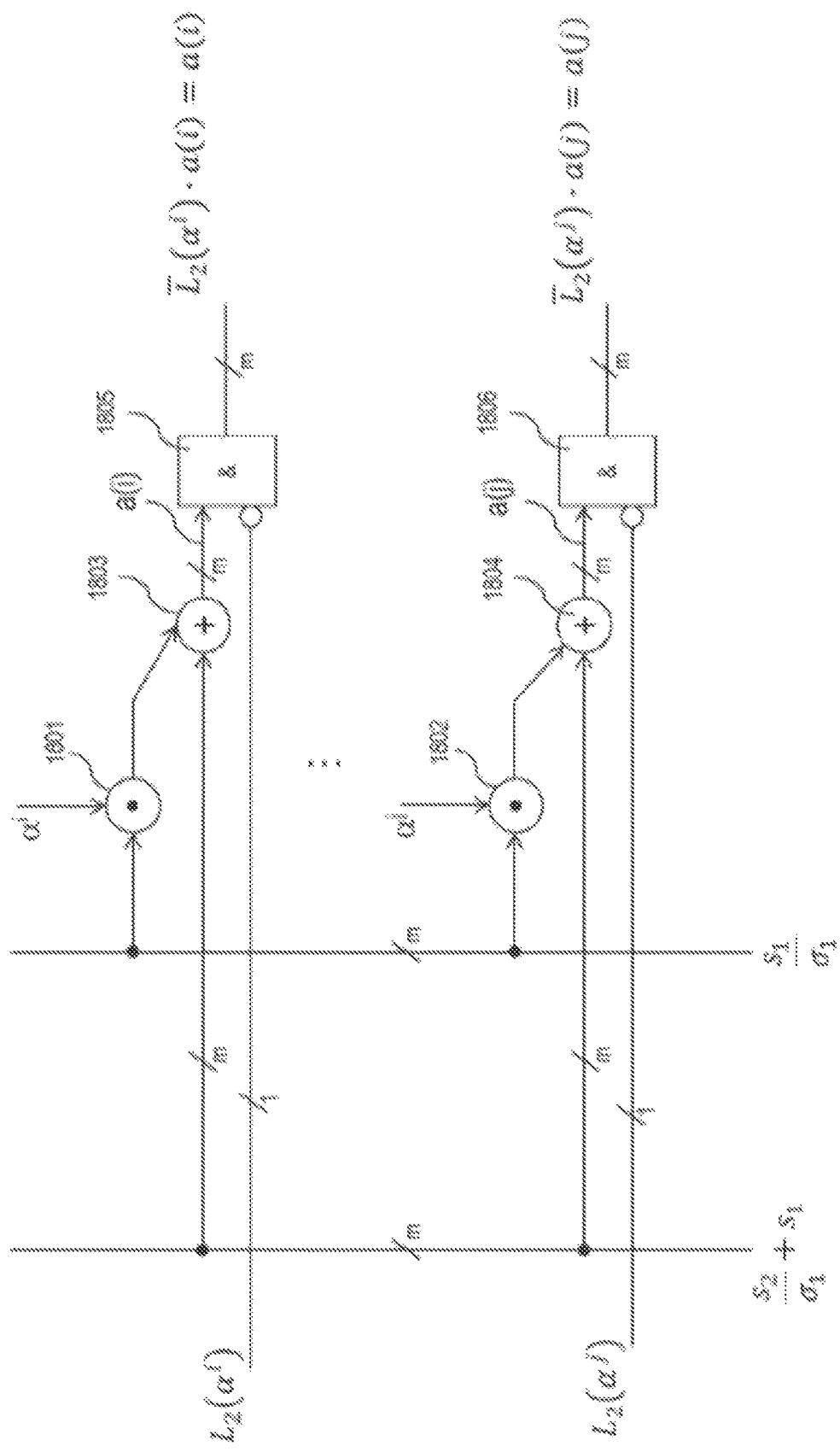
FIG. 18 shows an exemplary embodiment for the formation of the byte error correction values a(k) for the byte positions i and j.

FIG. 15 shows an exemplary embodiment for forming the term $$\frac{s_1}{\sigma_1},$$

which is an input signal for the circuit shown in FIG. 18. According to equation (49), $$\sigma_1 = \frac{s_1 s_4 + s_2 s_3}{s_1 s_3 + s_2^2}$$

thus yields $$\frac{s_1}{\sigma_1} = \frac{s_1}{\frac{s_1 s_4 + s_2 s_3}{s_1 s_3 + s_2^2}} = \frac{s_1^2 s_3 + s_1 s_2^2}{s_1 s_4 + s_2 s_3}.$$

To this end, the circuit depicted in FIG. 15 comprises Galois field multipliers 1501 to 1505, adders 1506 and 1507, squarers 1508 and 1509 and an inverter 1510.

Figure 16:
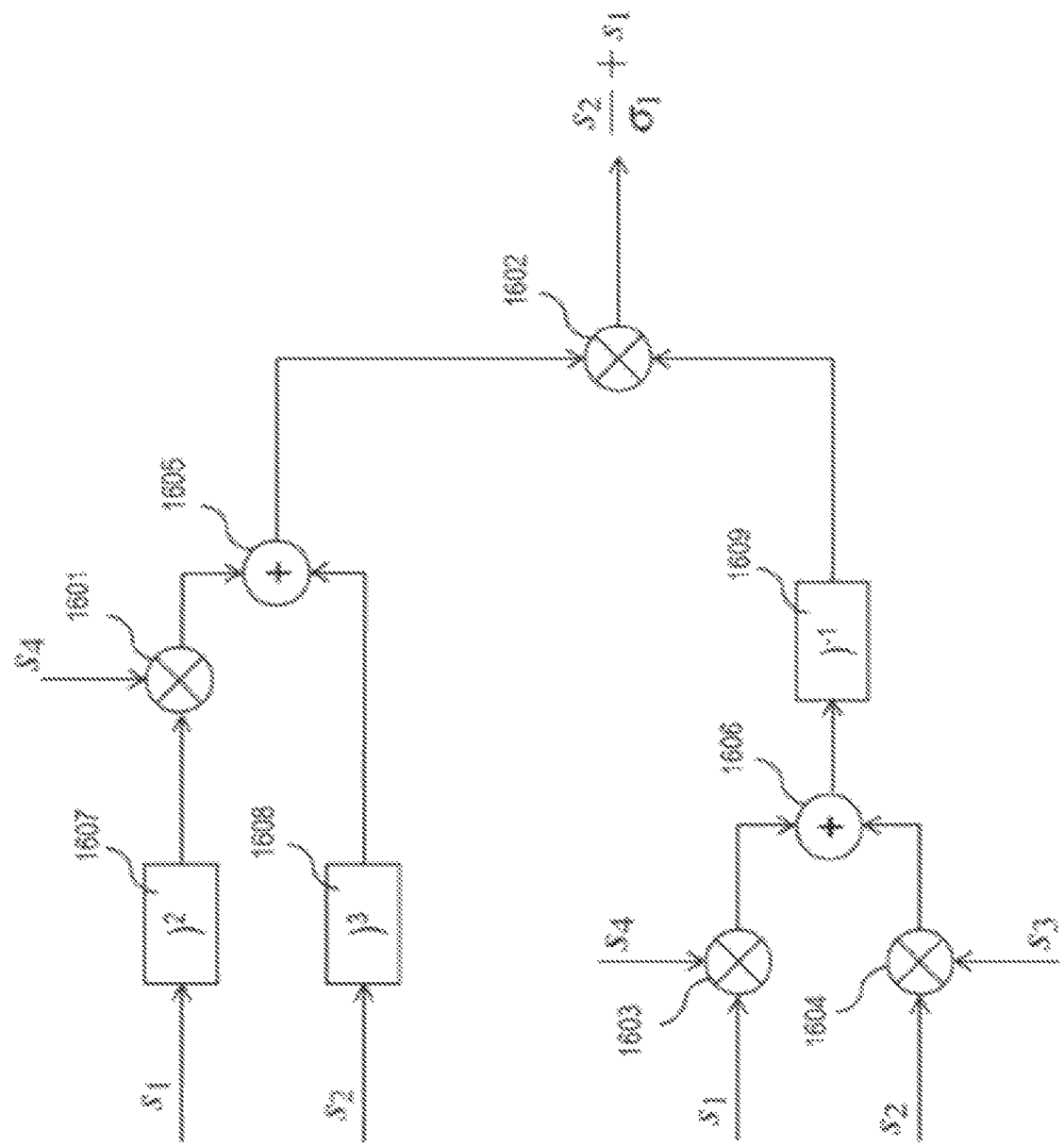
FIG. 16 shows an exemplary embodiment for the formation of the term $s_2/\sigma_1+s_1$.

FIG. 16 shows an exemplary embodiment for the formation of the term $$\frac{s_2}{\sigma_1} + s_1,$$

which is an input signal for the circuit shown in FIG. 18. Again, the following emerges from the use of equation (49):

$$\frac{s_2}{\sigma_1} + s_1 = \frac{s_2}{\frac{s_1 s_4 + s_2 s_3}{s_1 s_3 + s_2^2}} + s_1 =$$

$$= \frac{s_1 s_2 s_3 + s_2^3}{s_1 s_4 + s_2 s_3} + \frac{s_1(s_1 s_4 + s_2 s_3)}{s_1 s_4 + s_2 s_3} =$$

$$= \frac{s_1 s_2 s_3 + s_2^3 + s_1^2 s_4 + s_1 s_2 s_3}{s_1 s_4 + s_2 s_3} =$$

$$= \frac{s_2^3 + s_1^2 s_4}{s_1 s_4 + s_2 s_3}.$$

To this end, the circuit depicted in FIG. 16 comprises Galois field multipliers 1601 to 1604, adders 1605 and 1606, a squarer 1607, a third power forming unit 1608 and an inverter 1609.

Figure 17:
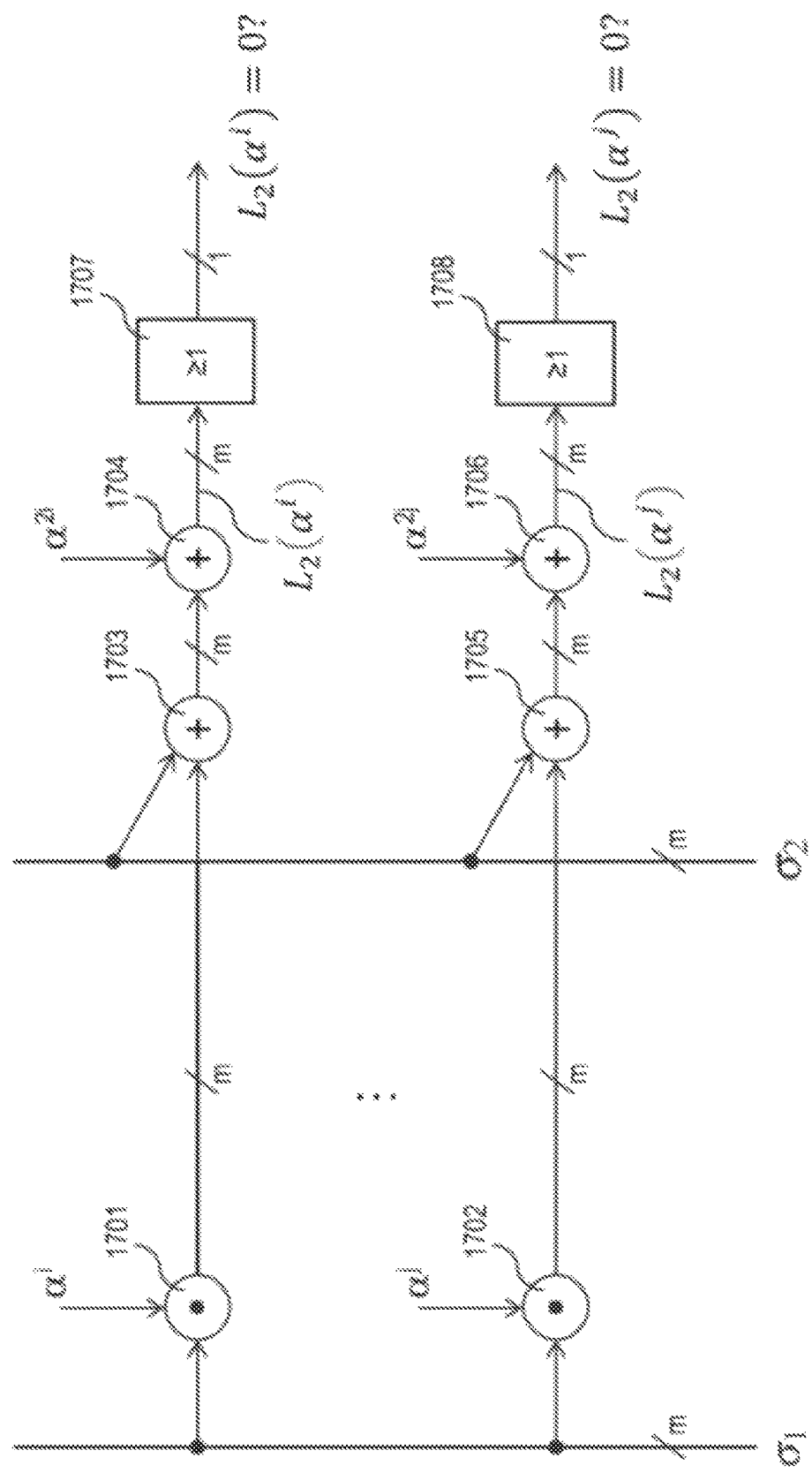
FIG. 17 shows an exemplary embodiment for the formation of the values of the locator polynomial on the basis of its coefficients $\sigma_1$ and $\sigma_2$ for byte positions i and j.

FIG. 17 shows an exemplary embodiment for the formation of the values of the locator polynomial on the basis of its coefficients $\sigma_1$ and $\sigma_2$ for byte positions l and j. If x in equation (48) is replaced by $\alpha^k$, the following emerges:

$$L_2(\alpha^k)=\alpha^{2k}+\sigma_1 \cdot \alpha^k+\sigma_2. \tag{66}$$

In FIG. 17, the determination of the locator polynomial according to equation (66) is shown for k=i, j. To this end, constant multipliers 1701 and 1702, adders 1703 to 1706 and OR gates 1707 and 1708 are used in exemplary fashion. The OR gate 1707, 1708 leads to ORing of the signals present at the m inputs such that the value 0 is only present at the output when the value 0 is present at all inputs. Consequently, the value 0 at the output of the respective OR gate indicates whether the condition $$L_2(\alpha^k)=0 \tag{67}$$

has been satisfied. As explained above, an error is present if this condition is satisfied.

FIG. 18 shows an exemplary embodiment for the formation of the byte error correction values a(k) for the byte positions i and j on the basis of the locator polynomial $L_2(\alpha^k)$ determined and provided according to FIG. 17, the term $s_2/\sigma_1+s_1$ determined according to FIG. 16, and the term $s_1/\sigma_1$ determined according to FIG. 15.

To this end, constant multipliers 1801 and 1802, adders 1803 to 1804 and AND gates 1805 and 1806 are used in exemplary fashion in FIG. 18, with one of the inputs of the respective AND gate being converted.

As explained in relation to FIG. 17, the value 0 indicates that the condition according to equation (67) has been satisfied. This means that an error could be ascertained at the byte position k. Conversely, no error was determined at the byte position k if $$L_2(\alpha^k) \neq 0$$

applies. Accordingly, the inverted value is passed to the input of the AND gate 1805, 1806, and hence the byte error correction value $$a(k) = \frac{s_2}{\sigma_1} + s_1 + \frac{s_1}{\sigma_1}\alpha^k.$$

according to equation (55) is only provided at the output of the AND gate 1805, 1806 if a byte error was determined at the byte position k by means of the locator polynomial.

What is claimed is:

1. A device comprising a memory and an error-correcting circuit arrangement, the circuit arrangement configured to:
   access a code word of a Reed Solomon error-correcting code, the code word comprising a plurality of bytes having corresponding positions,
   determine a first byte error position signal for a first erroneous byte of the code word,
   determine a first byte error correction value for correcting the first erroneous byte identified by the first byte error position signal, the first byte error correction value determined using a first value and a second value determined for each of at least two byte positions based on a coefficient of a locator polynomial, and
   correct the first erroneous byte based on the first byte error correction value.

2. The device of claim 1, wherein the circuit arrangement is configured to determine the first byte error position signal using components of an error syndrome of the error-correcting code.

3. The device of claim 1, wherein the circuit arrangement is configured to determine a byte error correction value for at least one correct byte.

4. The device of claim 1, wherein the circuit arrangement is configured to correct a 2-byte error.

5. The device of claim 1, wherein the Reed Solomon error-correcting code is in a Galois field $GF(2^m)$ and configured to correct at least 2-byte errors.

6. The device of claim 1, wherein:
   the circuit arrangement comprises an XOR circuit; and
   the circuit arrangement is configured to perform a multiplication of the first value by a constant assigned to the byte position and use the XOR circuit to XOR the first value with the second value, the multiplication by the constant is a multiplication in a Galois field $GF(2^m)$.

7. The device of claim 1, wherein the locator polynomial is a second degree polynomial and the coefficient of the locator polynomial is a coefficient of a linear term of the locator polynomial.

8. The device of claim 7, wherein the circuit arrangement is configured to determine the coefficient of the locator polynomial as a component-by-component XORing of $\alpha^i$ and $\alpha^j$ when the first byte error position signal and a second byte error position signal assume a first value for positions i and/to be corrected and other byte error positions assume a second value for all other positions to be corrected, the second value differing from the first value and $\alpha^i$ and $\alpha^j$ are determined by two zeros of the locator polynomial.

9. The device of claim 1, wherein:
   the bytes have m bits,
   four m-bit wide error syndrome components $S_1$, $S_2$, $S_3$ and $s_4$ are determinable, and
   the first and the second values are determined based on a value of the coefficient of the locator polynomial and based on two of the four m-bit wide error syndrome components.

10. The device of claim 9, wherein the four m-bit wide error syndrome components are determined such that the following holds true in case of a 2-byte error with a byte error value a=a(i) at an i-th byte position and a byte error value b=a(j) at a j-th byte position:

$$s_1=a+b,$$

$$s_2=\alpha^i \cdot a+\alpha^j \cdot b,$$

$$s_3=\alpha^{2i} \cdot a+\alpha^{2j} \cdot b,$$

$$s_4=\alpha^{3i} \cdot a+\alpha^{3j} \cdot b,$$

$\alpha^i$, $\alpha^j$ are elements of a Galois field $GF(2^m)$ which correspond to the byte positions i and j, and
a=a(i) and b=a(j) each comprise m bits.

11. The device of claim 9, wherein the four m-bit wide error syndrome components are determined such that the following holds true in case of a 2-byte error with a byte error value a=a(i) at an i-th byte position and a byte error value b=a(j) at a j-th byte position:

$$s_1=\alpha^i \cdot a+\alpha^j \cdot b,$$

$$s_2=\alpha^{2i} \cdot a+\alpha^{2j} \cdot b,$$

$$s_3 = \alpha^{3i} \cdot a + \alpha^{3j} \cdot b,$$

$$s_4 = \alpha^{4i} \cdot a + \alpha^{4j} \cdot b,$$

$\alpha^i$, $\alpha^j$ are elements of a Galois field $GF(2^m)$ which correspond to the byte positions i and j, and a=a(i) and b=a(j) each comprise m bits.

12. The device of claim 9, wherein the locator polynomial is a second degree polynomial according to $$L_2(x) = x^2 + \sigma_1 x + \sigma_2$$

with coefficients $\sigma_1$ and $\sigma_2$, with the first byte error correction value determined based on the coefficient $\sigma_1$.

13. The device of claim 9, wherein the first value is determined by $$\frac{s_1}{\sigma_1}$$

and the second value is determined by $$\frac{s_2}{\sigma_1} + s_1.$$

14. The device of claim 9, wherein the first byte error correction value a(i) for an i-th byte position is determined based on the coefficient $\sigma_1$ of the locator polynomial, according to $$a(i) = \frac{s_2}{\sigma_1} + s_1 + \frac{s_1}{\sigma_1} \cdot \alpha^i,$$

where $\alpha^i$ is an element of a Galois field $GF(2^m)$ which is assigned to the i-th byte position.

15. The device of claim 9, wherein the first byte error correction value a(i) for an i-th byte position is determined based on the coefficient $\sigma_1$ of the locator polynomial, according to $$a(i) = \left(\frac{s_2}{\sigma_1} + s_1\right) \cdot \alpha^{-i} + \frac{s_1}{\sigma_1},$$

where $\alpha^i$ is an element of a Galois field $GF(2^m)$ which is assigned to the i-th byte position.

16. The device of claim 9, wherein the first byte error correction value a(i) is determined such that the following holds true:

$$\frac{s_2}{\sigma_1} = s_2 \left( \frac{s_1 s_3 + s_2^2}{s_1 s_4 + s_2 s_3} \right)$$

and $$\frac{s_1}{\sigma_1} = s_1 \left( \frac{s_1 s_3 + s_2^2}{s_1 s_4 + s_2 s_3} \right).$$

17. The device of claim 9, wherein the first byte error position signal and/or the first byte error correction value are determined in parallel.

18. The device of claim 1, wherein the error-correcting code is a t-byte error correcting code, with at least (t+1) byte error position signals determined in parallel.

19. The device of claim 1, wherein the error-correcting code is a t-byte error correcting code, with at least (t+1) byte error correction values determined in parallel.

20. The device of claim 1, wherein the circuit arrangement is configured to correct the first byte error by virtue of the byte error position signal being linked with the byte error correction value for a byte at the erroneous byte position.

21. The device claim 1, wherein:
   the memory is a random-access memory (RAM); and
   the code word is accessed from one of the memory, a storage circuit, and a communication circuit.

22. A method for correcting at least one byte error in a code word implemented by a device, the method comprising:
   accessing the code word, wherein:
      the code word comprises a plurality of bytes having corresponding positions, and
      the code word is a code word of a Reed Solomon error-correcting code, determining a first byte error position signal for a first erroneous byte of the code word,
   determining a first byte error correction value for correcting the first erroneous byte identified by the first byte error position signal, the first byte error correction value determined using a first value and a second value determined for each of at least two byte positions based on a coefficient of a locator polynomial, and
   correcting the first byte error based on the first byte error correction value.

* * * * *